(12) United States Patent
Matsunaga et al.

(10) Patent No.: US 9,607,869 B2
(45) Date of Patent: Mar. 28, 2017

(54) BONDING SYSTEM

(71) Applicant: Tokyo Electron Limited, Tokyo (JP)

(72) Inventors: Masataka Matsunaga, Kumamoto (JP); Naoto Yoshitaka, Kumamoto (JP); Satoshi Nishimura, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 323 days.

(21) Appl. No.: 14/457,219

(22) Filed: Aug. 12, 2014

(65) Prior Publication Data
US 2015/0059985 A1 Mar. 5, 2015

(30) Foreign Application Priority Data

Aug. 29, 2013 (JP) ................. 2013-177750

(51) Int. Cl.
*H01L 21/67* (2006.01)
*H01L 23/00* (2006.01)
*H01L 21/68* (2006.01)

(52) U.S. Cl.
CPC .. *H01L 21/67173* (2013.01); *H01L 21/67092* (2013.01); *H01L 21/67109* (2013.01); *H01L 21/68* (2013.01); *H01L 24/75* (2013.01); *B32B 2457/14* (2013.01); *H01L 2224/753* (2013.01); *H01L 2224/7515* (2013.01); *H01L 2224/7565* (2013.01); *H01L 2224/75981* (2013.01); *H01L 2924/06* (2013.01); *H01L 2924/15788* (2013.01); *H01L 2924/20106* (2013.01)

(58) Field of Classification Search
CPC ............ H01L 21/677; H01L 21/67173; H01L 21/67184; H01L 21/67173; H01L 21/2007; H01L 21/187; B32B 2457/14

USPC ........................................................ 438/455
See application file for complete search history.

(56) References Cited

U.S. PATENT DOCUMENTS

2005/0005849 A1\* 1/2005 Masuoka ................ C23C 16/54
118/719

FOREIGN PATENT DOCUMENTS

| JP | 2001189292 A | \* | 7/2001 |
| JP | 2009-147033 A | | 7/2009 |
| JP | 2010-278249 A | | 12/2010 |
| JP | 2012-069900 A | | 4/2012 |
| JP | 2013-058571 A | | 3/2013 |

OTHER PUBLICATIONS

Machine translation of JP 2001-189292 date unknown.\*

\* cited by examiner

*Primary Examiner* — John Goff
(74) *Attorney, Agent, or Firm* — Abelman, Frayne & Schwab

(57) ABSTRACT

An object of the present disclosure is to reduce a footprint. A bonding system of the present disclosure includes a first processing station, a second processing station, and a carry-in/out station. The first processing station includes a first conveyance region, a coating device, a heating device, and a first delivery block. The second processing station includes a plurality of bonding devices, a second conveyance region, and a second delivery block. Each of the plurality of bonding devices bonds the first substrate to the second substrate. The second conveyance region is a region configured to convey the first substrate and the second substrate to and from the plurality of bonding devices. The second delivery block delivers the first substrate, the second substrate and the superimposed substrate between the first conveyance region and the second conveyance region.

7 Claims, 18 Drawing Sheets

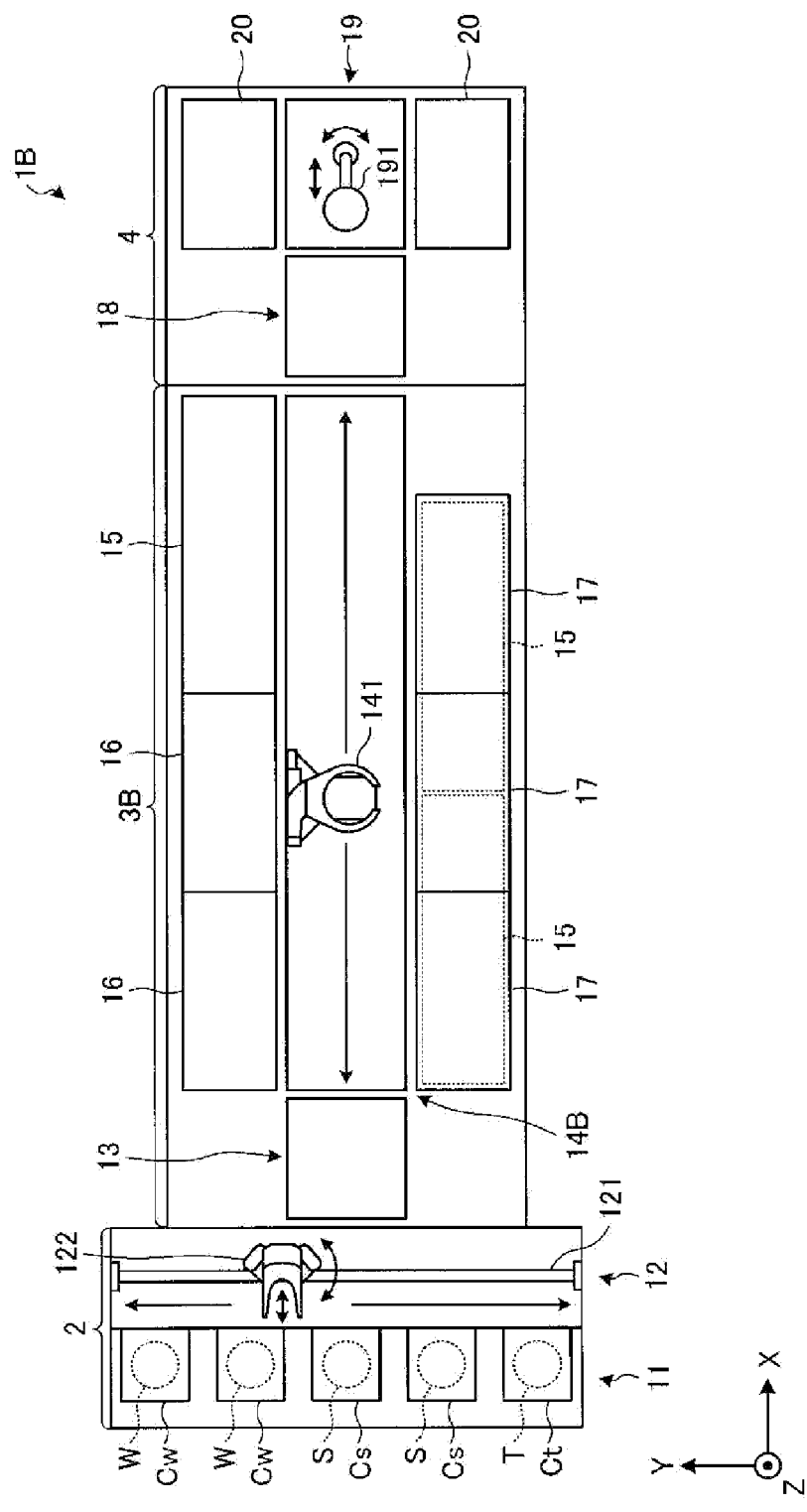

BONDING SYSTEM

CROSS-REFERENCE TO RELATED APPLICATIONS

This application is based on and claims priority from Japanese Patent Application No. 2013-177750, filed on Aug. 29, 2013, with the Japan Patent Office, the disclosure of which is incorporated herein in its entirety by reference.

TECHNICAL FIELD

The present disclosure relates to a bonding system.

BACKGROUND

In a process of manufacturing, for example, a semiconductor device, the diameter of a substrate to be processed such as a silicon wafer or a compound semiconductor wafer has recently been increased, and also, the thickness of the substrate to be processed has recently been decreased. When a thin substrate to be processed with a large diameter is conveyed or polished, warpage or crack may occur. Accordingly, the substrate to be processed is bonded to a supporting substrate such as, for example, a glass substrate, so as to reinforce the substrate to be processed.

Bonding of the substrate to be processed and the supporting substrate is performed by using a bonding device. In the bonding device, the supporting substrate and the substrate to be processed are held by, for example, an upper chuck and a lower chuck, respectively, and then are pressed by moving the upper chuck or the lower chuck. See, e.g., Japanese Laid-Open Patent Publication No. 2012-69900. An adhesive is applied on the surface of the substrate to be processed or the supporting substrate, and thus the substrate to be processed and the supporting substrate are pressed as described above to be bonded with each other.

Also, Japanese Laid-Open Patent Publication No. 2012-69900 discloses a bonding system, in which, besides the bonding device, for example, a conveyance device for conveying a substrate to be processed or a supporting substrate, a coating device for coating an adhesive to the substrate to be processed, and a heating device for heating the substrate to be processed coated with the adhesive are integrally incorporated.

SUMMARY

The present disclosure provides a bonding system configured to bond a first substrate to a second substrate, including: a first processing station and a second processing station configured to perform a predetermined processing on the first substrate and the second substrate, and a carry-in/out station configured to carry the first substrate, the second substrate, and a superimposed substrate obtained by bonding the first substrate to the second substrate into/out of the first processing station, in which the first processing station includes: a first conveyance region configured to convey the first substrate, the second substrate and the superimposed substrate, a coating device disposed to be adjacent to the first conveyance region and configured to coat an adhesive on the first substrate, a heating device disposed to be adjacent to the first conveyance region and configured to heat the first substrate coated with the adhesive, and a first delivery block configured to deliver the first substrate, the second substrate and the superimposed substrate between the carry-in/out station and the first conveyance region, and the second processing station includes: a plurality of bonding devices each of which is configured to bond the first substrate to the second substrate, a second conveyance region configured to convey the first substrate and the second substrate to and from the plurality of bonding devices, and a second delivery block configured to deliver the first substrate, the second substrate and the superimposed substrate between the first conveyance region and the second conveyance region.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 12B is a schematic plan view illustrating the configuration of a bonding system according to a second modified exemplary embodiment.

DETAILED DESCRIPTION

Figure 1:
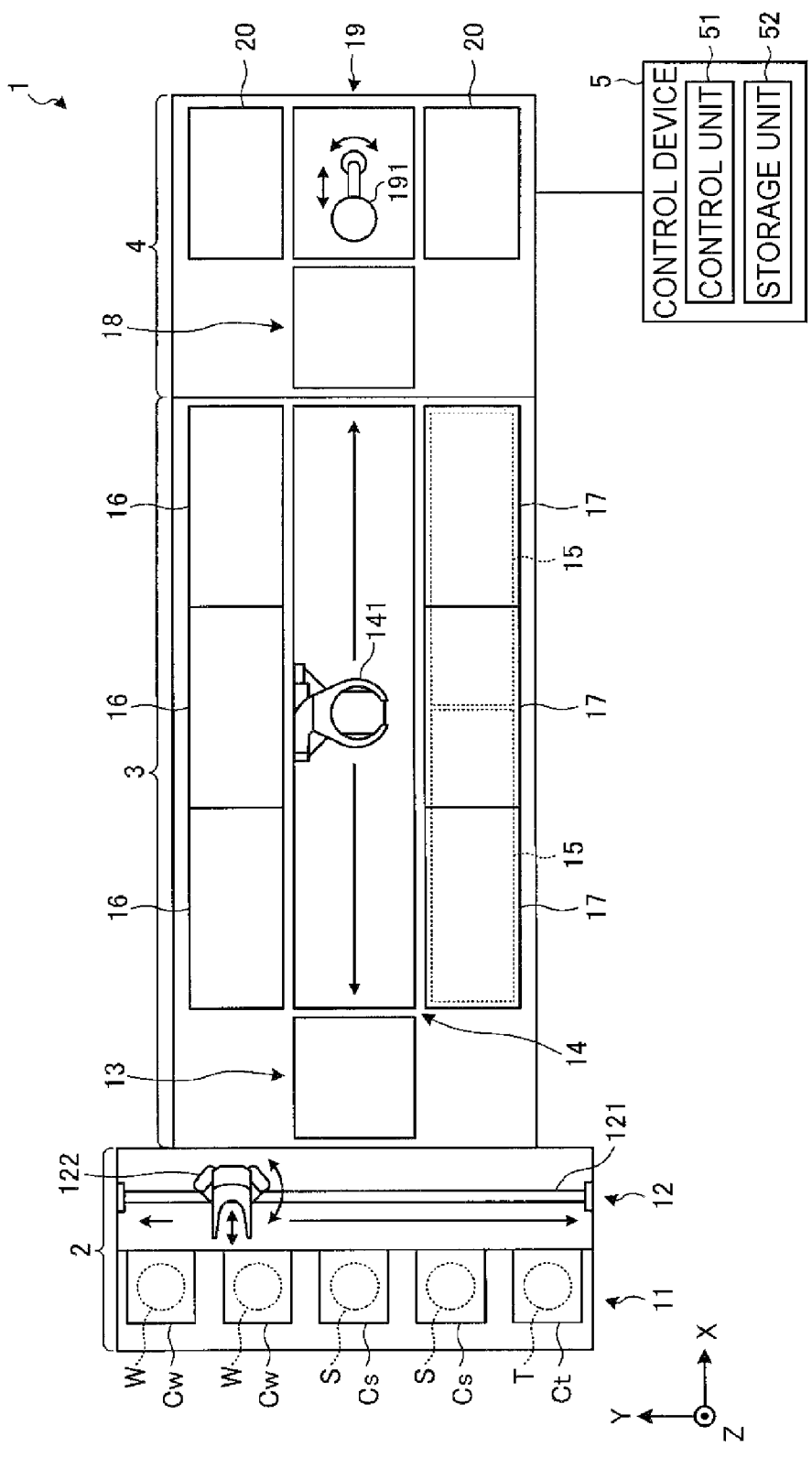
FIG. 1 is a schematic plan view illustrating the configuration of a bonding system according to an exemplary embodiment of the present disclosure.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

However, in the conventional technology as described above, there is room for further improvement in that a footprint which is a percentage of a bonding system occupying a bottom area, such as a clean room, is required to be reduced.

An aspect of the present disclosure is to provide a bonding system which may reduce a footprint.

According to a first aspect of the present disclosure, there is provided a bonding system including a first processing station, a second processing station, and a carry-in/out station. The first processing station and the second processing station perform a predetermined processing on a first substrate and a second substrate, and the carry-in/out station carries the first substrate, the second substrate, and a superimposed substrate obtained by bonding the first substrate to the second substrate into/out of the first processing station. The first processing station includes a first conveyance region, a coating device, a heating device, and a first delivery block. The first conveyance region is a region configured to convey the first substrate, the second substrate and the superimposed substrate. The coating device is disposed to be adjacent to the first conveyance region and configured to coat an adhesive on the first substrate. The heating device is disposed to be adjacent to the first conveyance region and configured to heat the first substrate coated with the adhesive. The first delivery block delivers the first substrate, the second substrate and the superimposed substrate between the carry-in/out station and the first conveyance region. The second processing station includes a plurality of bonding devices, a second conveyance region, and a second delivery block. Each of the plurality of bonding devices bonds the first substrate to the second substrate. The second conveyance region is a region configured to convey the first substrate and the second substrate to and from the plurality of bonding devices. The second delivery block delivers the first substrate, the second substrate and the superimposed substrate between the first conveyance region and the second conveyance region.

In the bonding system, the first processing station includes a removal device configured to remove the adhesive from a periphery of the first substrate coated with the adhesive, and the removal device is disposed above the coating device In the bonding system, the first delivery block includes: a first delivery unit on which the first substrate or the second substrate to be carried into the first conveyance region, or the superimposed substrate to be carried into the carry-in/out station is placed, and a buffer unit configured to temporarily hold the second substrate carried into the first conveyance region through the first delivery block In the bonding system, the second delivery block includes: a second delivery unit on which the first substrate or the second substrate to be carried into the second conveyance region, or the superimposed substrate to be carried into the first conveyance region is placed, and an inversion mechanism configured to invert the first substrate or the second substrate, and the second delivery unit and the inversion mechanism are stacked in multiple stages In the bonding system, a pressure within the second conveyance region is a positive pressure in relation to a pressure within the bonding devices In the bonding system, a pressure within the first conveyance region is a positive pressure in relation to a pressure within the coating device, a pressure within the heating device and a pressure within the removal device In the bonding system, the pressure within the removal device is a negative pressure in relation to the pressure within the coating device and the pressure within the heating device In the bonding system, the coating device is disposed at one side of the first conveyance region, and the heating device is disposed at the other side of the first conveyance region According to an aspect of the present disclosure, a footprint may be reduced.

Hereinafter, exemplary embodiments of a bonding system according to the present disclosure will be described in detail with reference to accompanying drawings. The present disclosure is not limited to the exemplary embodiments as described below.

<1. Configuration of Bonding System>

Figure 2:
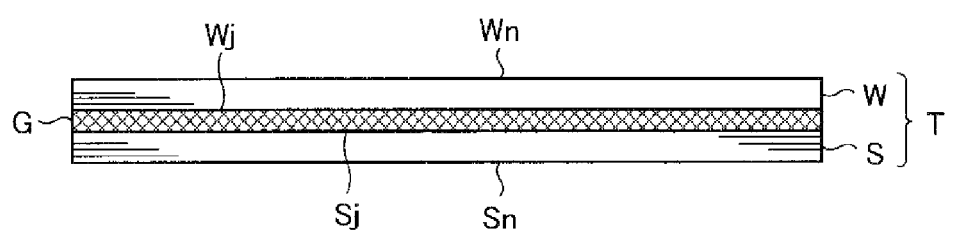
FIG. 2 is a schematic side view of a substrate to be processed and a supporting substrate.

First, a configuration of a bonding system according to an exemplary embodiment of the present disclosure will be described with reference to FIGS. 1 and 2. FIG. 1 is a schematic plan view illustrating the configuration of a bonding system according to the present exemplary embodiment. FIG. 2 is a schematic side view of a substrate to be processed and a supporting substrate. Hereinafter, in order to clarify the positional relationship, the X direction, the Y direction and the Z direction, which are perpendicular to each other, are defined, and the positive Z direction is defined as a vertical upward direction.

A bonding system 1 according to the present exemplary embodiment, as illustrated in FIG. 1 bonds a substrate to be processed W and a supporting substrate S (see FIG. 2) through an adhesive G to form a superimposed substrate T.

Hereinafter, as illustrated in FIG. 2, among surfaces of the substrate to be processed W, a surface to be bonded to the supporting substrate S through the adhesive G will be referred to as a "bonded surface Wj", and the surface opposite to the bonded surface Wj will be referred to as a "non-bonded surface Wn". Among surfaces of the supporting substrate S, a surface to be bonded to the substrate to be processed W through the adhesive G will be referred to as a "bonded surface Sj" and the surface opposite to the bonded surface Sj will be referred to as a "non-bonded surface Sn."

The substrate to be processed W is a substrate to become a product. Specifically, the substrate to be processed W is a semiconductor substrate, such as a silicon wafer or a compound semiconductor wafer, on which a plurality of electronic circuits are formed and a surface on which the electronic circuits are formed is set as the bonded surface Wj. The substrate to be processed W is bonded to the supporting substrate S, and then the non-bonded surface Wn is polished so that the substrate to be processed W is thinned.

The supporting substrate S is, for example, a glass substrate, and has substantially the same diameter as that of the substrate to be processed W. As the adhesive G, for example, a thermoplastic resin is used.

As illustrated in FIG. 1, the bonding system 1 includes a carry-in/out station 2, a first processing station 3, and a second processing station 4. The carry-in/out station 2, the first processing station 3 and the second processing station 4 are disposed to be arranged in parallel in this order in the positive X direction.

The carry-in/out station 2 includes a mounting stage 11 and a conveyance region 12. Cassettes Cw, Cs, and Ct, each of which horizontally accommodates a plurality of substrates (e.g., 25 substrates), are mounted on the mounting stage 11. A cassette Cw is configured to accommodate substrates to be processed W, a cassette Cs is configured to accommodate supporting substrates S, and a cassette Ct is configured to accommodate superimposed substrates T.

The conveyance region 12 is disposed to be adjacent to the positive X direction side of the mounting stage 11. A conveyance path 121 extending in the Y direction and a conveyance device 122 movable along the conveyance path 121 are provided in the conveyance region 12. The conveyance device 122 is also movable in the X direction and also rotatable around the Z-axis so as to convey the substrates to be processed W, the supporting substrates S and the superimposed substrates T between the cassettes Cw, Cs, and Ct mounted on the mounting stage 11, and a delivery block 13 of the first processing station 3 to be described below.

Meanwhile, the number of the cassettes Cw, Cs, and Ct mounted on the mounting stage 11 is not limited to the illustrated example. For example, besides the cassettes Cw, Cs, and Ct, a cassette configured to collect a defective substrate may be mounted in the mounting stage 11.

The first processing station 3 is connected to the carry-in/out station 2. The first processing station 3 includes the delivery block 13 (corresponding to an exemplary "first delivery block"), a conveyance region 14 (corresponding to an exemplary "first conveyance region"), a plurality of coating devices 15, a plurality of heating devices 16, and a plurality of removal devices 17.

The delivery block 13 is disposed to be adjacent to the positive X direction side of the conveyance region 12. The conveyance region 14 is disposed to be adjacent to the positive X direction side of the delivery block 13. The coating devices 15 and the removal devices 17 are disposed to be adjacent to the negative Y direction side of the conveyance region 14, and the heating devices 16 are disposed to be adjacent to the positive Y direction side of the conveyance region 14.

The removal devices 17 are disposed to be stacked on the top of the coating devices 15. The heating devices 16 are stacked in multiple stages. This feature will be described later.

The delivery block 13 is disposed between the conveyance region 12 and the conveyance region 14. In the delivery block 13, the substrates to be processed W, the supporting substrates S and the superimposed substrates T are delivered between the conveyance device 122 of the conveyance region 12 and a conveyance device 141 of the conveyance region 14 to be described later.

The conveyance device 141 is disposed in the conveyance region 14. The conveyance device 141 is movable in the X direction and the Y direction and is rotatable around the Z axis, and conveys the substrates to be processed W, the supporting substrates S and the superimposed substrates T between the delivery block 13, the coating devices 15, the heating devices 16, the removal devices 17 and a delivery block 18 of the second processing station 4 to be described later.

The coating device 15 is a device configured to coat an adhesive G on a bonded surface Wj of a substrate to be processed W, and the heating device 16 is a device configured to heat the substrate to be processed W coated with the adhesive G to a predetermined temperature. The removal device 17 is a device configured to supply an organic solvent such as a thinner to a periphery of the substrate to be processed W coated with the adhesive G so that the adhesive G is removed from the periphery. Specific configurations of the coating device 15, the heating device 16 and the removal device 17 will be described later.

The second processing station 4 is connected to the first processing station 3. The second processing station 4 includes the delivery block 18 (corresponding to an exemplary "second delivery block"), a conveyance region 19 (corresponding to an exemplary "second conveyance region"), and a plurality of bonding devices 20.

The delivery block 18 is disposed to be adjacent to the positive X direction side of the conveyance region 14, and the conveyance region 19 is disposed to be adjacent to the positive X direction side of the delivery block 18. The plurality of bonding devices 20 (here, two bonding devices) are disposed to be adjacent to the positive Y direction side and the negative Y direction side of the conveyance region 19, respectively.

The delivery block 18 is disposed between the conveyance region 14 and the conveyance region 19. In the delivery block 18, the substrates to be processed W, the supporting substrates S and the superimposed substrates T are delivered between the conveyance device 141 of the conveyance region 14, and a conveyance device 191 of the conveyance region 19 to be described later.

The conveyance device 191 is disposed in the conveyance region 19. The conveyance device 191 is movable in the X direction and the Y direction and is rotatable around the Z axis, and conveys the substrates to be processed W, the supporting substrates S and the superimposed substrates T between the delivery block 18 and the bonding devices 20.

The bonding device 20 bonds the substrate to be processed W to the supporting substrate S. A specific configuration of the bonding device 20 will be described later.

The bonding system 1 includes a control device 5. The control device 5 controls an operation of the bonding system 1. The control device 5 is, for example, a computer, and includes a control unit 51 and a storage unit 52. The storage unit 52 stores programs configured to control various processings such as a bonding processing. The control unit 51 reads out and executes the programs stored in the storage unit 52 to control the operation of the bonding system 1.

The programs may be those that have been stored in a computer-readable storage medium and installed to the storage unit 52 of the control device 5 from the storage medium. The computer-readable storage medium may be, for example, a hard disc (HD), a flexible disc (FD), a compact disc (CD), a magnetic optical disc (MO) or a memory card.

In the bonding system 1 configured as described above, the conveyance device 122 of the conveyance region 12 takes a substrate to be processed W out of the cassette Cw mounted on the mounting stage 11. The wafer W taken out by the conveyance device 122 is carried into the conveyance region 14 through the delivery block 13.

The substrate to be processed W carried into the conveyance region 14 is carried into the coating device 15 by the conveyance device 141, and a bonded surface Wj is coated with an adhesive G by the coating device 15 (see FIG. 2).

The two coating devices 15 disposed in the first processing station 3 may be configured to coat different kinds of adhesives G to the substrate to be processed W, respectively. In this case, for example, the coating device 15 at one side coats the substrate to be processed W with an adhesive G, and the coated substrate to be processed W is carried into the heating device 16 to be described later so that the adhesive G becomes harder than when the adhesive G is coated. Then, the substrate to be processed W is carried into the coating device 15 at the other side, and is coated with a different kind of adhesive G by the coating device 15 at the other side. In this manner, two kinds of adhesives G may be coated on the substrate to be processed W.

Then, the substrate to be processed W is carried out of the coating device 15 by the conveyance device 141, and is carried into the heating device 16. The heating device 16 heats the substrate to be processed W in its interior kept in, for example, an inert atmosphere, so that a solvent, such as an organic solvent, included in the adhesive G is evaporated and the adhesive G becomes harder than when the adhesive G is coated. Then, the temperature of the substrate to be processed W is controlled to a predetermined temperature, for example, a room temperature, by the heating device 16.

Then, the substrate to be processed W is carried out of the heating device 16 by the conveyance device 141, and is carried into the removal device 17 so that the adhesive G coated on the periphery is removed by the removal device 17. Then, the substrate to be processed W is taken out of the removal device 17 by the conveyance device 141, is conveyed to the conveyance region 19 through the delivery block 18, and is carried into the bonding device 20 by the conveyance device 191 provided in the conveyance region 19.

Meanwhile, a supporting substrate S is taken out of the cassette Cs mounted on the mounting stage 11 by the conveyance device 122 of the conveyance region 12, and is carried into the conveyance region 14 through the delivery block 13 by the conveyance device 141 of the conveyance region 14.

The supporting substrate S carried into the conveyance region 14 is conveyed to the delivery block 18 by the conveyance device 141, conveyed to the conveyance region 19 by the conveyance device 191 of the conveyance region 19, and is carried into the bonding device 20.

When the substrate to be processed W and the supporting substrate S are carried into the bonding device 20, a bonding processing of the substrate to be processed W and the supporting substrate S is performed by the bonding device 20. Accordingly, a superimposed substrate T is formed. Then, the superimposed substrate T is conveyed to the carry-in/out station 2 from the second processing station 4 by the conveyance devices 191, 141, and 122, and is accommodated in the cassette Ct mounted on the mounting stage 11 of the carry-in/out station 2. In this manner, a series of processings is finished.

Figure 3A:
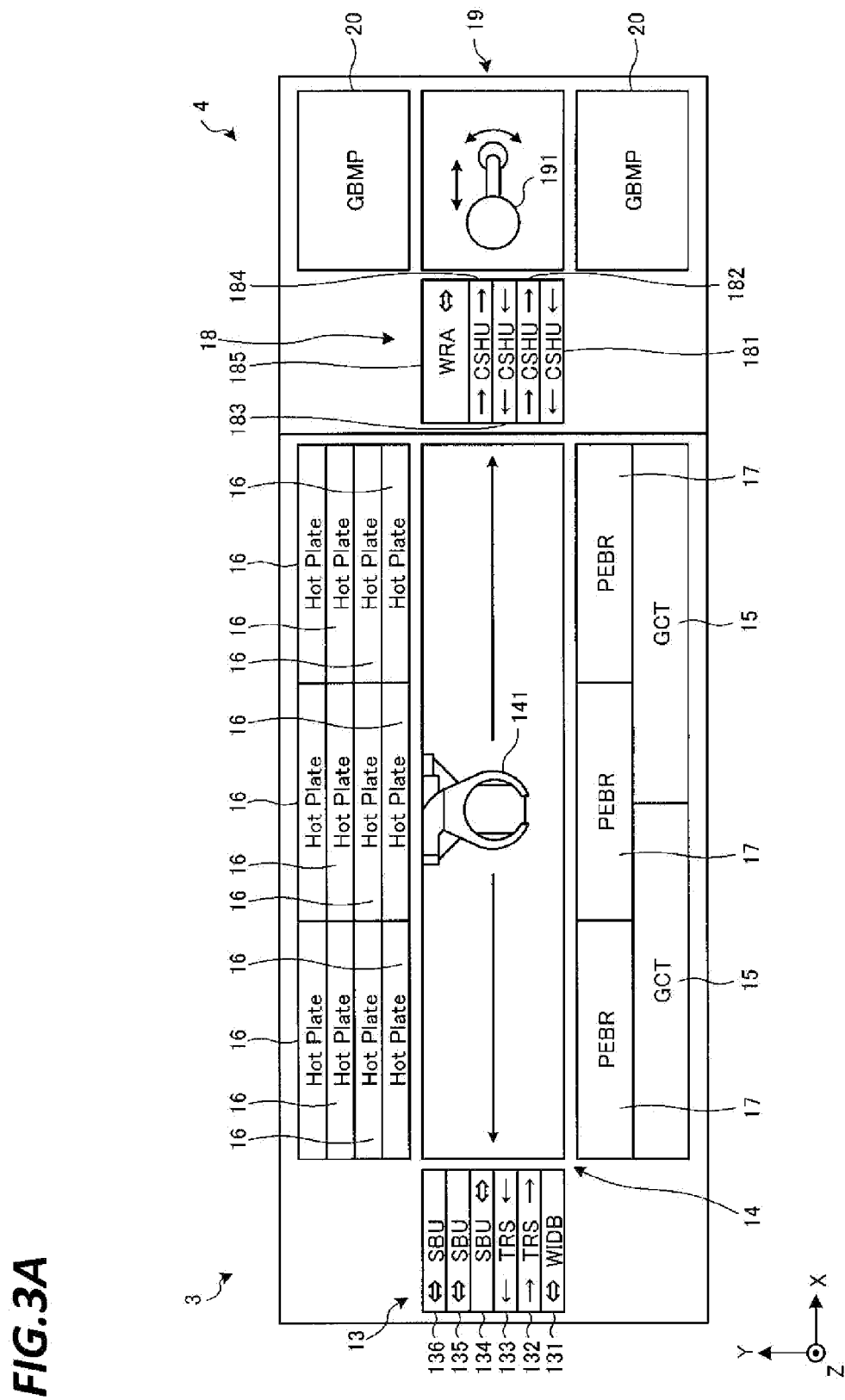
FIG. 3A is a schematic plan view illustrating the configuration of a first processing station and a second processing station.
Figure 3B:
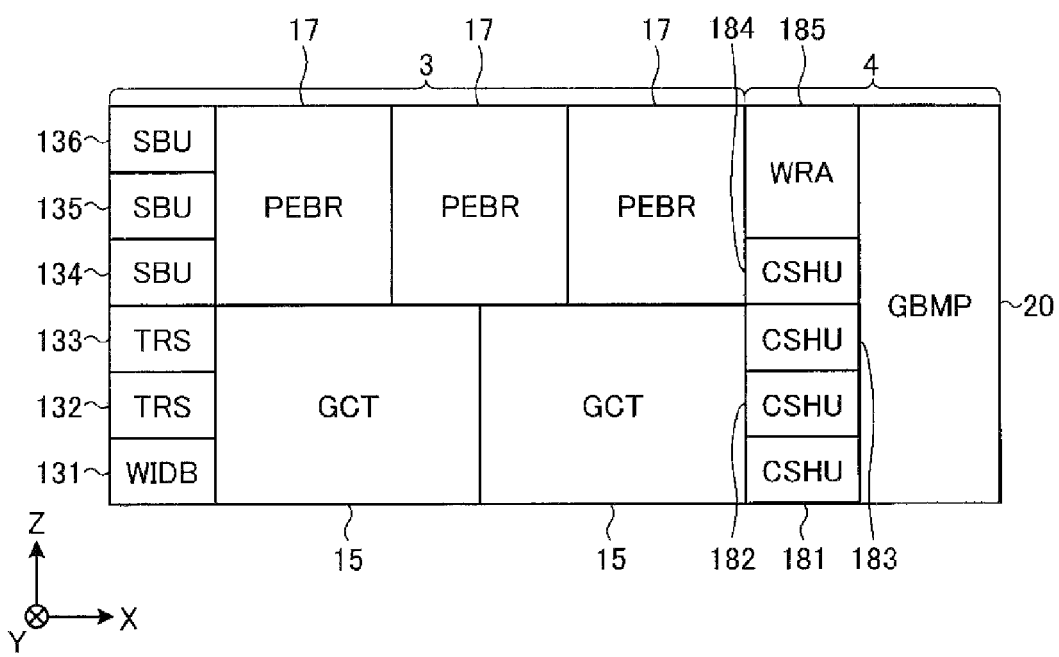
FIG. 3B is a schematic side view illustrating the configuration of the first processing station and the second processing station.

Hereinafter, a specific configuration of the first processing station 3 and the second processing station 4 will be described with reference to FIGS. 3A and 3B. FIG. 3A is a schematic plan view illustrating the configuration of the first processing station 3 and the second processing station 4, and FIG. 3B is a schematic side view of the same. FIG. 3B illustrates the schematic side view of the first processing station 3 and the second processing station 4 when viewed from the negative Y direction side.

As illustrated in FIG. 3A, the delivery block 13 of the first processing station 3 includes an ID (Identification) reader 131, delivery units 132 and 133 (corresponding to an exemplary "first delivery unit"), a first buffer unit 134 (corresponding to an exemplary "buffer unit"), and second buffer units 135 and 136.

In the drawing, the ID reader 131 is stated as "WIDB", the delivery units 132 and 133 are stated as "TRS", the first buffer unit 134 and the second buffer units 135 and 136 are stated as "SBU."

The delivery block 18 of the second processing station 4 includes delivery units 181 to 184 (corresponding to an exemplary "second delivery unit"), and a pre-aligner having an inversion mechanism (hereinafter, simply referred to as a "pre-aligner") 185. In the drawing, the delivery units 181 to 184 are stated as "CSHU", and the pre-aligner 185 is stated as "WRA."

In FIG. 3A, in order to facilitate understanding, stereoscopically stacked units are expressed in two dimensions. That is, the ID reader 131, the delivery units 132 and 133, the first buffer unit 134, and the second buffer units 135 and 136 as illustrated in FIG. 3A are stacked in multiple stages in the order of the ID reader 131, the delivery units 132 and 133, the first buffer unit 134, and the second buffer units 135 and 136 from bottom to top, as illustrated in FIG. 3B. The delivery units 181 to 184 and the pre-aligner 185 provided in the delivery block 18 are also stacked in multiple stages in the order of the delivery units 181 to 184 and the pre-aligner 185 from bottom to top.

In FIG. 3A, the removal devices 17 are illustrated as if the removal devices 17 are provided between the conveyance region 14 and the coating devices 15, but in actuality, as illustrated in FIG. 3B, the removal devices 17 are stacked on the top of the coating devices 15, and both the coating devices 15 and the removal devices 17 are adjacent to the conveyance region 14. Likewise, in FIG. 3A, the plurality of heating devices 16 are illustrated as if they are aligned in two dimensions. However, in actuality, four heating devices 16 stacked in multiple stages form a block, and such blocks are disposed in three columns to be aligned along the conveyance direction, so that all the heating devices 16 are adjacent to the conveyance region 14.

In FIG. 3A, arrows are assigned on respective units of the delivery block 13 and the delivery block 18, which indicate a conveyance direction of a substrate. For example, an arrow in the X positive direction is assigned on the delivery unit 132 of the delivery block 13, which indicates that a substrate (specifically, a substrate to be processed W or a supporting substrate S) is conveyed from the conveyance region 12 of the carry-in/out station 2 (see FIG. 1) to the conveyance region 14 of the first processing station 3 through the delivery unit 132. Likewise, an arrow in the X negative direction is assigned on the delivery unit 133 of the delivery block 13, which indicates that a substrate (specifically, a superimposed substrate T) is conveyed from the conveyance region 14 of the first processing station 3 to the conveyance region 12 of the carry-in/out station 2 through the delivery unit 133.

A bidirectional arrow is assigned on the negative X direction side of the ID reader 131 and the second buffer units 135 and 136 of the delivery block 13, which indicates that the ID reader 131 and the second buffer units 135 and 136 are accessed by the conveyance device 122 (see FIG. 1) provided in the conveyance region 12. Likewise, a bidirectional arrow is assigned on the positive X direction side of the first buffer unit 134, which indicates that the first buffer unit 134 is accessed by the conveyance device 141 provided in the conveyance region 14.

The ID reader 131 of the first processing station 3 is a device configured to read out an ID attached to the substrate to be processed W. The substrate to be processed W is carried in or out of the ID reader 131 by the conveyance device 122 provided in the conveyance region 12 of the carry-in/out station 2.

The delivery unit 132 is a unit on which a substrate conveyed from the conveyance region 12 to the conveyance region 14, that is, a substrate to be processed W or a supporting substrate S, is placed. The substrate to be processed W or the supporting substrate S is placed on the delivery unit 132 by the conveyance device 122 of the conveyance region 12, and is taken out of the delivery unit 132 by the conveyance device 141 of the conveyance region 14.

The delivery unit 133 is a unit on which a substrate conveyed from the conveyance region 14 to the conveyance region 12, that is, a superimposed substrate T, is placed. The superimposed substrate T is placed on the delivery unit 133 by the conveyance device 141 of the conveyance region 14, and is taken out of the delivery unit 133 by the conveyance device 122 of the conveyance region 12.

The first buffer unit 134 is a unit configured to temporarily hold one or more supporting substrates S, and is accessed by the conveyance device 141 of the conveyance region 14. The supporting substrates S carried into the conveyance region 14 through the delivery block 13 are carried into the first buffer unit 134 if necessary.

That is, the substrate to be processed W is carried into the first processing station 3, is sequentially conveyed to the coating device 15, the heating device 16 and the removal device 17, and conveyed to the second processing station 4. In contrast, the supporting substrate S passes by the first processing station 3 without being conveyed to the coating device 15, the heating device 16 and the removal device 17, and is carried into the second processing station 4. As described above, there are many places which accept the substrates to be processed W, such as the coating devices 15, the heating devices 16 and the removal devices 17. In contrast, the number of places which accept the supporting substrates S is fewer than that of places which accept the substrates to be processed W.

Meanwhile, the bonding system 1 is configured such that the substrates to be processed W and the supporting substrates S are taken out of the cassettes Cw and Cs alternately and carried into the first processing station 3.

Accordingly, in some situations, even though there are empty places (the coating devices 15, the heating devices 16, and the removal devices 17) which accept the substrates to be processed W, places (the delivery unit 132, the second buffer units 135 and 136, the delivery units 182 and 184, and the bonding device 20) which accept the supporting substrates S may be packed earlier. Then, new substrates to be processed W may not be carried into the first processing station 3, thereby lowering the throughput.

Therefore, in the bonding system 1, the first buffer unit 134 is provided in the delivery block 13 to temporarily hold the supporting substrates S carried into the conveyance region 14. This may reduce a situation where the places which accept the supporting substrates S are packed, thereby improving the throughput.

The second buffer units 135 and 136 are units which temporarily hold the substrates to be processed W, the supporting substrates S or the superimposed substrates T, and are accessed by the conveyance device 122 of the conveyance region 12. The second buffer units 135 and 136 are used to carry as many substrates to be processed W or supporting substrates S as possible into the bonding system 1 so that a processing is not interrupted until new cassettes Cw and Cs are mounted on the mounting stage 11 after, for example, the cassette Cw or the cassette Cs is vacated. Meanwhile, the second buffer units 135 and 136 are also used as buffers for holding as many superimposed substrates T as possible within the bonding system 1 so that a processing is not interrupted until an empty cassette Ct is mounted on the mounting stage 11 after the cassette Ct is fully packed.

The substrates to be processed W or the supporting substrates S are processed at a room temperature in the coating devices 15 and the removal devices 17, processed at about 100° C. to 350° C. in the heating devices 16, and processed at about 200° C. to 250° C. in the bonding devices 20.

Therefore, in the bonding system 1, the coating devices 15 and the removal devices 17 are disposed at the negative Y direction side of the conveyance region 14, the heating devices 16 are disposed at the positive Y direction side of the conveyance region 14, and the second processing station 4 is disposed at the positive X direction side of the conveyance region 14.

In this manner, in the bonding system 1, units having the same processing temperature are disposed to be integrated at the same side of the conveyance region 14. Accordingly, a temperature control may be easily performed.

As illustrated in FIGS. 3A and 3B, in the bonding system 1, the removal devices 17 are disposed to be stacked on the top of the coating devices 15.

When a plurality of units is stacked on the top of one another, it is difficult to put straight down a draining pipe of a unit disposed at the upper side. In general, the draining pipe at the upper side is meandered to take a detour around a unit disposed at the lower side. However, when a viscosity of a drainage flowing in the draining pipe is high, the drainage may be easily collected in, for example, a meandering portion of the draining pipe, thereby deteriorating the maintainability.

Here, an adhesive G is discharged as a drainage from the coating devices 15. Meanwhile, an organic solvent having a lower viscosity than the adhesive G, such as a thinner, is discharged as a drainage from the removal devices 17. Thus, in the bonding system 1, the removal devices 17 having a lower drainage viscosity than the coating devices 15 are disposed on the top of the coating devices 15. Accordingly, the drainage may be properly discharged from the bonding system 1.

The delivery units 182 and 184 of the delivery block 18 are units on which substrates conveyed from the conveyance region 14 to the conveyance region 19, that is, substrates to be processed W or supporting substrates S, are placed. The substrates to be processed W or the supporting substrates S are placed on the delivery units 182 and 184 by the conveyance device 141 of the conveyance region 14, and taken out of the delivery units 182 and 184 by the conveyance device 191 of the conveyance region 19.

The delivery units 181 and 183 are units on which substrates conveyed from the conveyance region 19 to the conveyance region 14, that is, superimposed substrates T, are placed. The superimposed substrates T are placed on the delivery units 181 and 183 by the conveyance device 191 of the conveyance region 19 and taken out of the delivery units 181 and 183 by the conveyance device 141 of the conveyance region 14.

The pre-aligner 185 is a unit configured to adjust a horizontal orientation of a substrate to be processed W or a supporting substrate S, and is accessed by the conveyance device 191 of the conveyance region 19. The pre-aligner 185 has an inversion mechanism, and additionally performs a processing of inverting the front and rear sides of the substrate to be processed W carried by the conveyance device 191.

Here, in a conventional bonding device, for each bonding device, a delivery unit, a pre-aligner having an inversion mechanism, and a conveyance device are provided, thereby causing an increase of a footprint. In contrast, in the bonding system 1 according to the present exemplary embodiment, as illustrated in FIG. 3A, the plurality of bonding devices 20 shares the delivery units 181 to 184, the pre-aligner 185 and the conveyance device 191.

Accordingly, according to the bonding system 1 according to the present exemplary embodiment, a footprint may be reduced as compared to in the conventional bonding system.

In the conventional bonding device, the pre-aligner having the inversion mechanism and the delivery unit are horizontally placed, while in the bonding system 1 according to the present exemplary embodiment, the delivery units 181 to 184 and the pre-aligner 185 are stacked on the top of one another. Accordingly, in this respect as well, the footprint may be reduced as compared to in the conventional bonding system.

Figure 4:
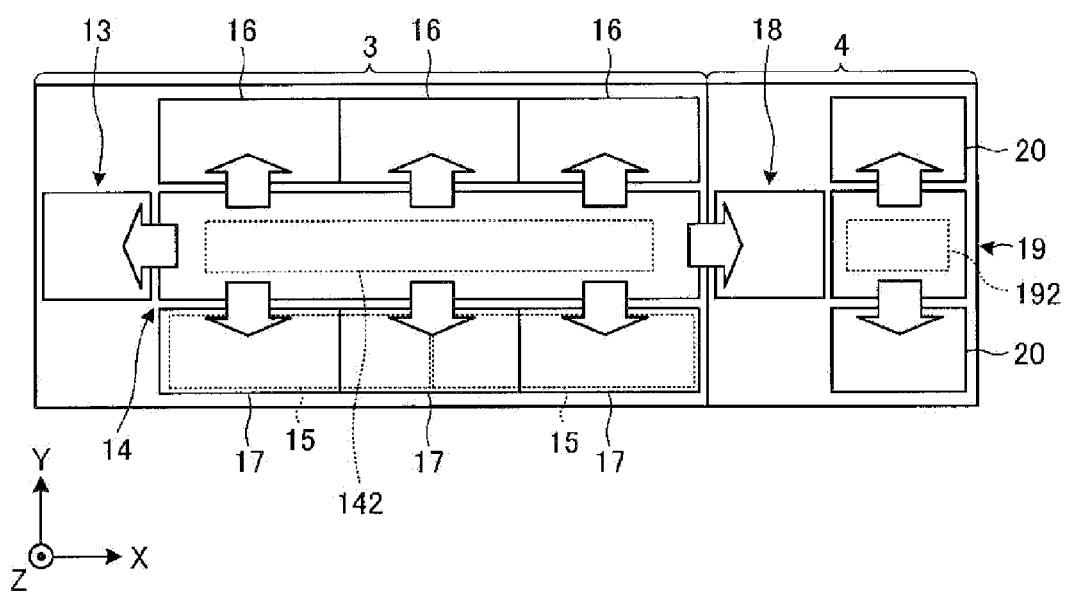
FIG. 4 is an explanatory view of an airflow occurring within the bonding system.

Then, a magnitude relation of a pressure within the bonding system 1 will be described with reference to FIG. 4. FIG. 4 is an explanatory view of an airflow occurring within the bonding system 1. White arrows illustrated in FIG. 4 indicate directions of airflows.

As illustrated in FIG. 4, a fan filter unit (FFU) 142 is provided in the conveyance region 14 of the first processing station 3. The FFU 142 is provided in a ceiling portion of the conveyance region 14 to form a downflow within the conveyance region 14. Likewise, a FFU 192 is provided in the conveyance region 19 of the second processing station 4. The FFU 192 is provided in a ceiling portion of the conveyance region 19 to form a downflow within the conveyance region 19. Although not illustrated herein, FFUs are provided in the coating devices 15, the heating devices 16, the removal devices 17, and the bonding devices 20, respectively. By the FFUs, the inside of the bonding system 1 is in a positive pressure state in relation to the outside.

In the first processing station 3, the pressure within the conveyance region 14 becomes highest. Accordingly, pressures within the delivery block 13, the coating device 15, the heating device 16, the removal device 17 and the delivery block 18 become negative pressures in relation to the pressure within the conveyance region 14. When an opening/closing shutter (not illustrated) of the delivery block 13, the coating device 15, the heating device 16, the removal device 17 or the delivery block 18 is opened, an airflow directing from the conveyance region 14 to the delivery block 13, the coating device 15, the heating device 16, the removal device 17 or the delivery block 18 occurs.

In the second processing station 4, the pressure within the conveyance region 19 becomes highest. Accordingly, the pressure within the bonding device 20 becomes a negative pressure in relation to the pressure within the conveyance region 19. When an opening/closing shutter of the bonding device 20 is opened, an airflow directing from the conveyance region 19 to the bonding device 20 occurs. Meanwhile, the pressure within the conveyance region 14 is substantially the same as the pressure within the conveyance region 19.

As described above, in the bonding system 1, pressures of respective units adjacent to the conveyance regions 14 and 19 are set to be lower than pressures of the conveyance region 14 and the conveyance region 19. Accordingly, the smell within the bonding system 1, for example, the smell of an organic solvent used for the removal device 17, such as a thinner, may be prevented from being leaked to the outside of the bonding system 1 from the conveyance region 14 or the conveyance region 19.

In the bonding system 1, a pressure of the bonding device 20 among the respective units adjacent to the conveyance regions 14 and 19 is set to be higher than pressures of other units. Accordingly, as compared to other units, for example, particles hardly flow into the bonding device 20, and thus a bonding processing between a substrate to be processed W and a supporting substrate S may be properly performed.

In the bonding system 1, a pressure within the removal device 17 is set to be lower than pressures of the coating device 15 and the heating device 16. Accordingly, the smell of an organic solvent used for the removal device 17, such as a thinner, may be more securely prevented from being leaked to the outside of the bonding system 1.

<2. Configuration of Coating Device>

Figure 5A:
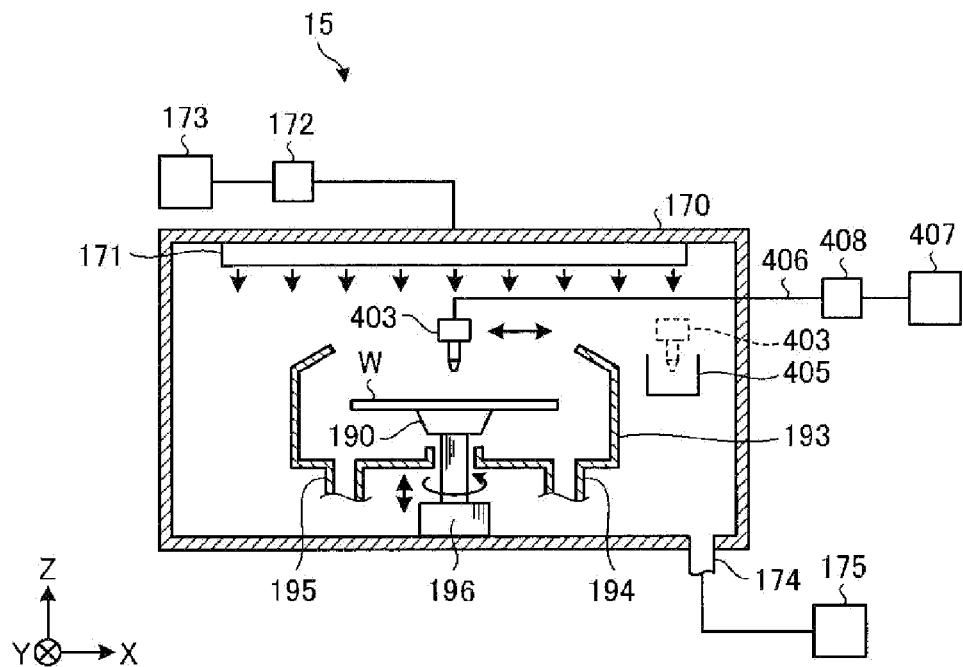
FIG. 5A is a schematic side view illustrating the configuration of a coating device.
Figure 5B:
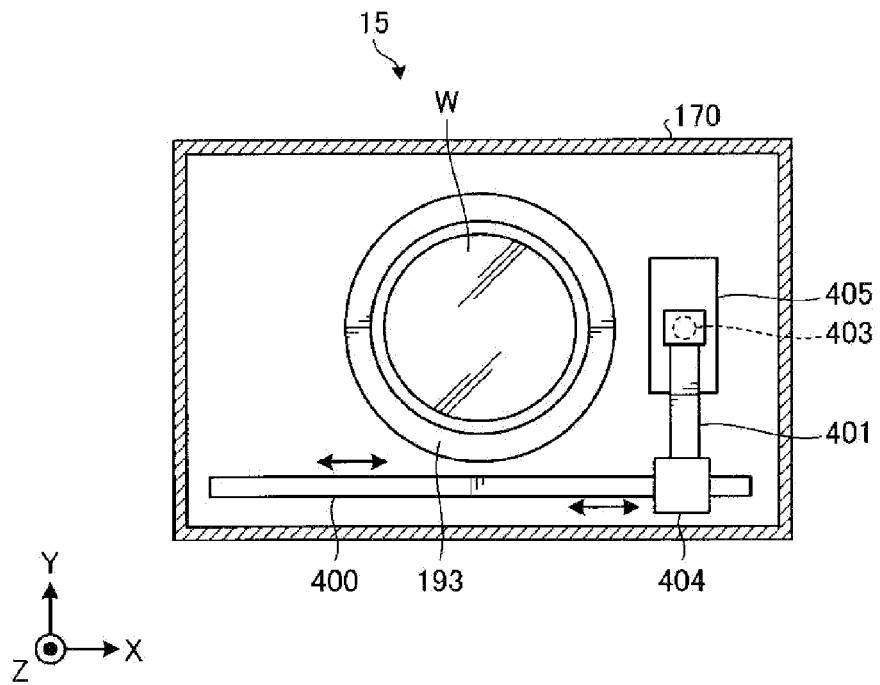
FIG. 5B is a schematic plan view illustrating the configuration of the coating device.

Hereinafter, the configuration of the coating device 15 as described above will be described with reference to FIGS. 5A and 5B. FIG. 5A is a schematic side view illustrating the configuration of the coating device 15, and FIG. 5B is a schematic plan view of the same.

As illustrated in FIG. 5A, the coating device 15 has a processing container 170 of which the inside may be sealed. A side surface of the processing container 170 at the conveyance region 14 (see FIG. 1) side is formed with a carry-in/out port (not illustrated) of a substrate to be processed W, and the carry-in/out port is provided with an opening/closing shutter (not illustrated).

A spin chuck 190 configured to hold and rotate the substrate to be processed W is provided at the central portion within the processing container 170. The spin chuck 190 has a horizontal top surface which is formed with, for example, a suction port (not illustrated) configured to suck the substrate to be processed W. By the suction from the suction port, the substrate to be processed W may be sucked to and held on the spin chuck 190.

Under the spin chuck 190, a chuck driving unit 196 provided with, for example, a motor, is provided. The spin chuck 190 may be rotated at a predetermined speed by the chuck driving unit 196. The chuck driving unit 196 is provided with a lift driving source such as, for example, a cylinder, so that the spin chuck 190 may be lifted.

Around the spin chuck 190, a cup 193 is provided to receive and recover a liquid scattered or dropped from the substrate to be processed W. A discharge tube 194 configured to discharge the recovered liquid and an exhaust tube 195 configured to evacuate the atmosphere within the cup 193 to a vacuum state are connected to the bottom of the cup 193.

As illustrated in FIG. 5B, a rail 400 extending along the X direction is provided at the negative Y direction side of the cup 193. For example, the rail 400 extends from the outside of the cup 193 at the negative X direction side to the outside of the cup 193 at the positive X direction side. An arm 401 is attached to the rail 400.

As illustrated in FIGS. 5A and 5B, the arm 401 supports an adhesive nozzle 403 configured to supply an adhesive G in a liquid state to the substrate to be processed W. Meanwhile, the adhesive G is mixed with a solvent such as an organic solvent and liquefied to have a lower viscosity than a normal adhesive, and thus the adhesive G is easily spread on the substrate to be processed W.

The arm 401 is freely moved on the rail 400 by a nozzle driving unit 404 as illustrated in FIG. 5B. Accordingly, the adhesive nozzle 403 may be moved from a standby section 405 provided at the outside of the cup 193 at the positive X direction side to a location above the central portion of the substrate to be processed W within the cup 193, and may be moved above the substrate to be processed W in the radial direction of the substrate to be processed W. The arm 401 may be freely lifted by the nozzle driving unit 404, and may adjust the height of the adhesive nozzle 403.

The adhesive nozzle 403, as illustrated in FIG. 5A, is connected to a supply tube 406 configured to supply the adhesive G to the adhesive nozzle 403. The supply tube 406 is communicated with an adhesive supply source 407 that stores the adhesive G therein. The supply tube 406 is provided with a supply device group 408 that includes, for example, a valve or a flow rate control unit that controls the flow of the adhesive G.

A FFU 171 is provided in a ceiling portion of the processing container 170. The FFU 171 forms a downflow within the processing container 170. A gas supply source 173 is connected to the FFU 171 through a supply device group 172 that includes, for example, a valve or a flow rate control unit. The bottom of the processing container 170 is formed with an intake port 174 configured to suck the atmosphere of the inside of the processing container 170. The intake port 174 is connected to a negative pressure generating device 175 such as, for example, a vacuum pump.

In the coating device 15 configured as described above, the substrate to be processed W carried into the coating device 15 by the conveyance device 141 of the conveyance region 14 is sucked and held by the spin chuck 190. Here, a non-bonded surface Wn of the substrate to be processed W is sucked and held.

Subsequently, the adhesive nozzle 403 of the standby section 405 is moved to a position above the central portion of the substrate to be processed W by the arm 401. Then, the adhesive G is supplied from the adhesive nozzle 403 to a bonded surface Wj of the substrate to be processed W while rotating the substrate to be processed W by the spin chuck 190. The supplied adhesive G is diffused over the entire bonded surface Wj of the substrate to be processed W by a centrifugal force, so that the adhesive G is coated on the bonded surface Wj of the substrate to be processed W.

<3. Configuration of Heating Device>

Figure 6A:
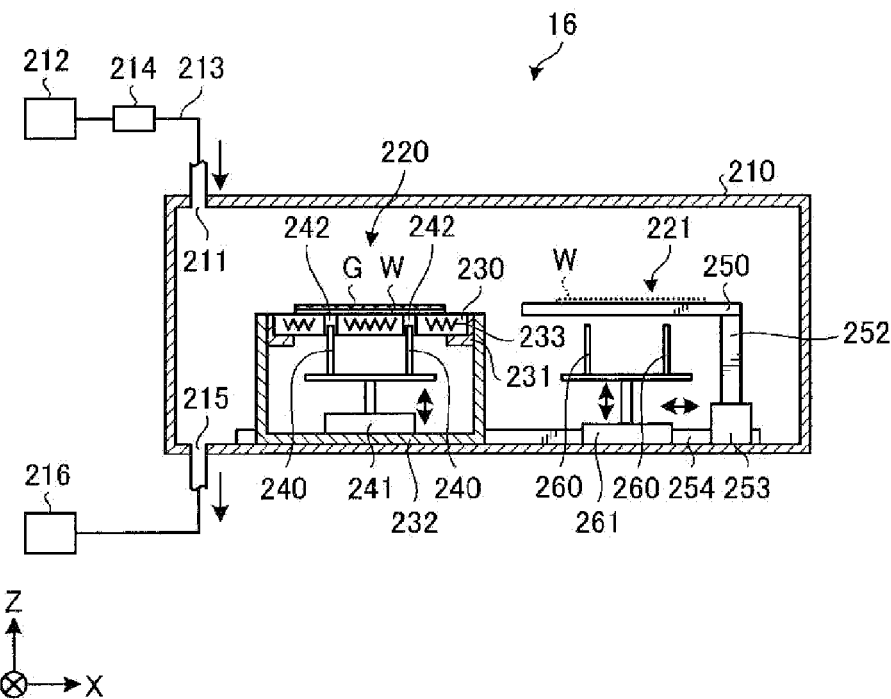
FIG. 6A is a schematic side view illustrating the configuration of a heating device.
Figure 6B:
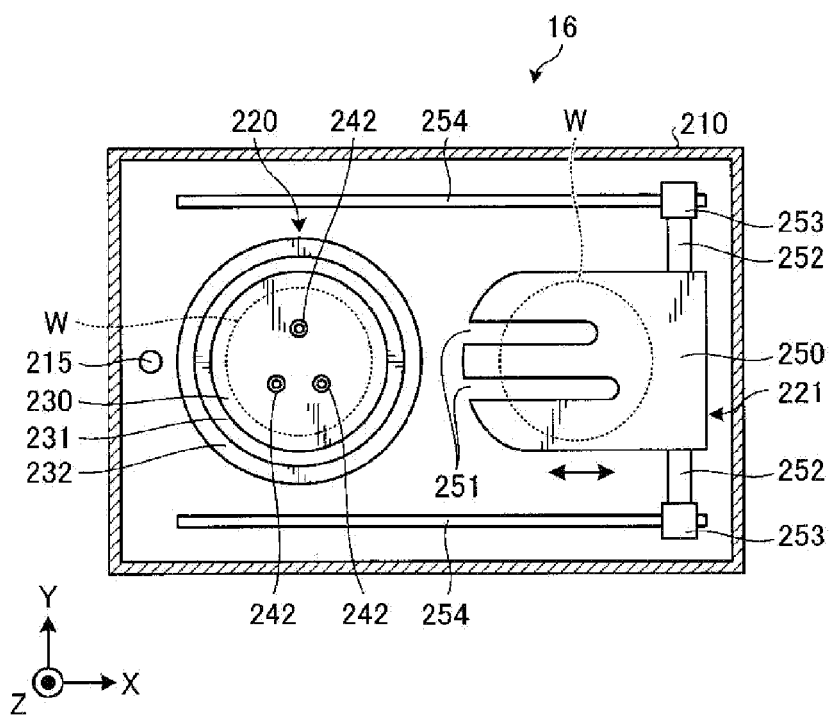
FIG. 6B is a schematic plan view illustrating the configuration of the heating device.

Hereinafter, the configuration of the heating device 16 will be described with reference to FIGS. 6A and 6B. FIG. 6A is a schematic side view illustrating the configuration of the heating device 16, and FIG. 6B is a schematic plan view of the same.

As illustrated in FIG. 6A, the heating device 16 includes a processing container 210 of which the inside may be closed. A side surface of the processing container 210 at the conveyance region 14 (see FIG. 1) side is formed with a carry-in/out port (not illustrated) of a substrate to be processed W, and the carry-in/out port is provided with an opening/closing shutter (not illustrated).

A ceiling of the processing container 210 is formed with a gas supply port 211 configured to supply an inert gas such as, for example, a nitrogen gas, to the inside of the processing container 210. The gas supply port 211 is connected to a gas supply tube 213 which is communicated with a gas supply source 212. The gas supply tube 213 is provided with a supply device group 214 that includes, for example, a valve or a flow rate control unit that controls the flow of the inert gas.

The bottom of the processing container 210 is formed with an intake port 215 configured to suck the atmosphere of the inside of the processing container 210. The intake port 215 is connected to a negative pressure generating device 216 such as, for example, a vacuum pump.

Within the processing container 210, a heating section 220 configured to perform a heating processing on the substrate to be processed W, and a temperature control section 221 configured to control the temperature of the substrate to be processed W are provided. The heating section 220 and the temperature control section 221 are arranged in parallel to each other in the X direction.

The heating section 220 is provided with an annular holding member 231 configured to accommodate a heat plate 230 so as to hold the outer periphery of the heat plate 230, and a support ring 232 of a substantially cylindrical shape that surrounds the outer periphery of the holding member 231. The heat plate 230 is formed in a substantially disk shape with a thickness, and configured to heat the substrate to be processed W placed thereon. The heat plate 230 includes, for example, a heater 233 embedded therein. The heating temperature of the heat plate 230 may be controlled by, for example, the control unit 51 so as to heat the substrate to be processed W placed on the heat plate 230 to a predetermined temperature.

Under the heat plate 230, for example, three lift pins 240 configured to support and lift the substrate to be processed W from the bottom are provided. The lift pins 240 may be moved up and down by a lift driving unit 241. In the vicinity of the central portion of the heat plate 230, through holes 242 that extend through the heat plate 230 in the thickness direction are formed at, for example, three locations. The lift pins 240 are adapted to be inserted through the through holes 242 to protrude from the top surface of the heat plate 230.

The temperature control section 221 includes a temperature control plate 250. As illustrated in FIG. 6B, the temperature control plate 250 has a substantially rectangular flat shape and an end face at the heat plate 230 side is curved in a circular arc shape. Two slits 251 are formed on the temperature control plate 250 in the Y direction. The slits 251 are formed to extend from an end face of the temperature control plate 250 at the heat plate 230 side to a position in the vicinity of the central portion of the temperature control plate 250. With the aid of the slits 251, the temperature control plate 250 may be prevented from interfering with the lift pins 240 of the heating section 220, and lift pins 260 of the temperature control section 221 to be described later. The temperature control plate 250 includes a temperature control member (not illustrated) such as, for example, a Peltier element, which is embedded in the temperature control plate 250. The cooling temperature of the temperature control plate 250 is controlled by, for example, the control unit 51 so that the substrate to be processed W placed on the temperature control plate 250 is cooled to a predetermined temperature.

As illustrated in FIG. 6A, the temperature control plate 250 is supported on a support arm 252. A driving unit 253 is attached to the support arm 252. The driving unit 253 is attached to a rail 254 extending in the X direction. The rail 254 extends from the temperature control section 221 to the heating section 220. With the aid of the driving unit 253, the temperature control plate 250 is adapted to be movable between the heating section 220 and the temperature control section 221 along the rail 254.

Under the temperature control plate 250, for example, three lift pins 260 configured to support and lift the substrate to be processed W from the bottom side are provided. The lift pins 260 may be moved up and down by a lift driving unit 261. The lift pins 260 are adapted to be inserted through the slits 251 to protrude from the top surface of the temperature control plate 250.

In the heating device 16 configured as described above, when the substrate to be processed W is carried into the processing container 210 by the conveyance device 141 of the conveyance region 14, the substrate to be processed W is received by the lift pins 260 which have been moved up in advance and on standby. Then, the lift pins 260 are moved down so that the substrate to be processed W is placed on the temperature control plate 250.

Then, the temperature control plate 250 is moved along the rail 254 to a position above the heat plate 230 by the driving unit 253, and the substrate to be processed W is delivered to the lift pins 240 which have been moved up in advance and on standby. Then, the lift pins 240 are moved down so that the substrate to be processed W is placed on the heat plate 230. The substrate to be processed W on the heat plate 230 is heated to a predetermined temperature in the range of, for example, 100° C. to 350° C. By heating using the heat plate 230, the adhesive G on the substrate to be processed W is heated to be cured.

Then, the lift pins 240 are moved up and the temperature control plate 250 is moved to a position above the heat plate 230. Subsequently, the substrate to be processed W is delivered from the lift pins 240 to the temperature control plate 250, and the temperature control plate 250 is moved to the conveyance region 14 side. During the movement of the temperature control plate 250, the temperature of the substrate to be processed W is controlled to a predetermined temperature.

<4. Configuration of Removal Device>

Figure 7:
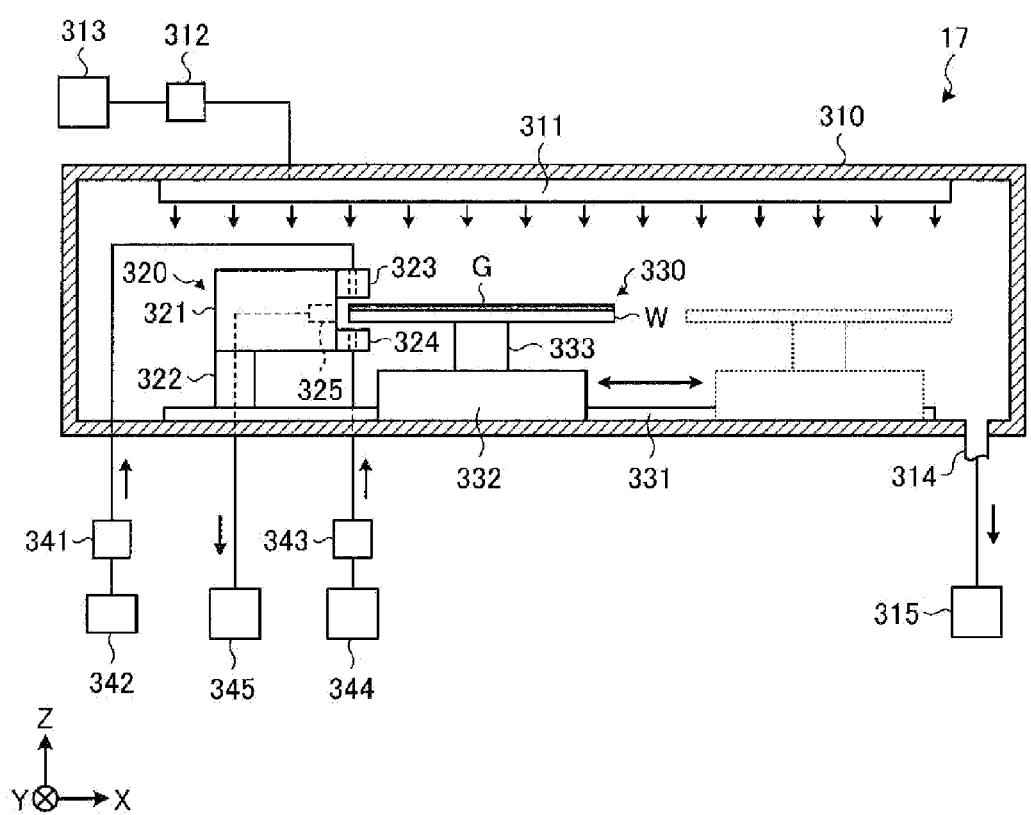
FIG. 7 is a schematic side view illustrating the configuration of a removal device.

Hereinafter, the configuration of the removal device 17 will be described with reference to FIG. 7. FIG. 7 is a schematic side view illustrating the configuration of the removal device 17.

As illustrated in FIG. 7, the removal device 17 includes a processing container 310 of which the inside may be closed. A side surface of the processing container 310 at the conveyance region 14 (see FIG. 1) side is formed with a carry-in/out port (not illustrated) of a substrate to be processed W, and the carry-in/out port is provided with an opening/closing shutter (not illustrated).

A FFU 311 is provided in a ceiling portion of the processing container 310. The FFU 311 forms a downflow within the processing container 310. A gas supply source 313 is connected to the FFU 311 through a supply device group 312 that includes, for example, a valve or a flow rate control unit. The bottom of the processing container 310 is formed with an intake port 314 configured to suck the atmosphere of the inside of the processing container 310. The intake port 314 is connected to a negative pressure generating device 315 such as, for example, a vacuum pump.

A solvent supply section 320 and a suction moving section 330 are provided within the processing container 310. The solvent supply section 320 is provided at the negative X direction side within the processing container 310, and the suction moving section 330 is provided at the positive X direction side within the processing container 310.

The solvent supply section 320 includes a main body 321, a support member 322 configured to support the main body 321 at a predetermined height, an upper nozzle 323 and a lower nozzle 324 provided at the outside of the main body 321 at the positive X direction side, and a suction unit 325 provided at the inside of the main body 321 at the positive X direction side.

The upper nozzle 323 and the lower nozzle 324 are attached to the outside of the main body 321, and are arranged to face each other and to be spaced apart from each other. The upper nozzle 323 discharges an organic solvent such as, for example, a thinner downward, and the lower nozzle 324 discharges the organic solvent upward. Each of the upper nozzle 323 and the lower nozzle 324 is connected to an organic solvent supply source 342 and 344 through a supply device group 341 and 343 that includes, for example, a valve or a flow rate control unit.

The suction unit 325 is formed between the upper nozzle 323 and the lower nozzle 324, and sucks the organic solvent discharged from the upper nozzle 323 and the lower nozzle 324. The suction unit 325 is connected to a negative pressure generating device 345 such as, for example, a vacuum pump.

The suction moving section 330 includes a rail 331 extending in the X direction, a moving mechanism 332 moving along the rail 331, and a suction holding unit 333 provided above the moving mechanism 332 to suck and hold the substrate to be processed W.

In the removal device 17 configured as described above, when the substrate to be processed W is carried into the processing container 310 by the conveyance device 141 of the conveyance region 14, the substrate to be processed W is sucked and held by the suction holding unit 333. Then, the moving mechanism 332 is moved along the rail 331 so that the periphery of the substrate to be processed W is located between the upper nozzle 323 and the lower nozzle 324.

Then, the organic solvent is discharged from the upper nozzle 323 and the lower nozzle 324. Accordingly, the organic solvent is supplied to the periphery of the substrate to be processed W so that the adhesive G coated on the periphery of the substrate to be processed W is removed. The organic solvent discharged from the upper nozzle 323 and the lower nozzle 324 is sucked by the suction unit 325.

<5. Configuration of Delivery Unit>

Figure 8A:
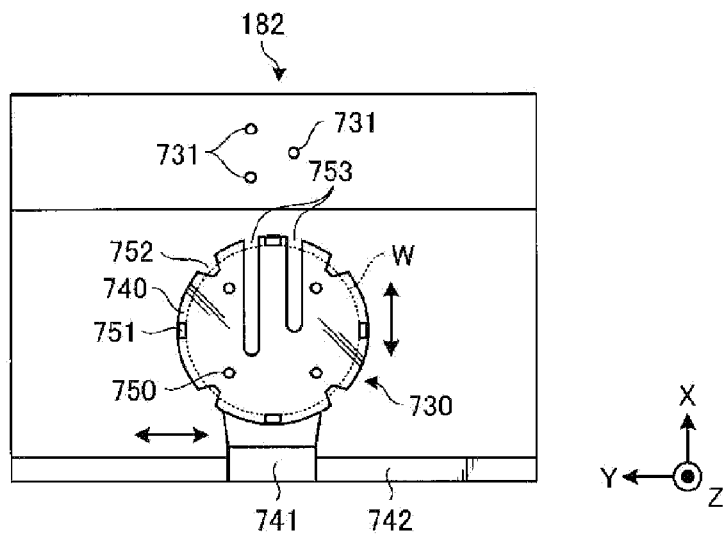
FIG. 8A is a schematic plan view illustrating the configuration of a delivery unit.
Figure 8B:
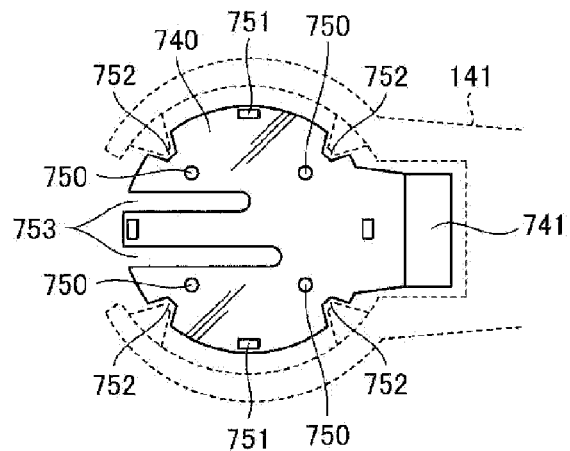
FIG. 8B is a schematic plan view illustrating the configuration of a delivery arm.
Figure 8C:
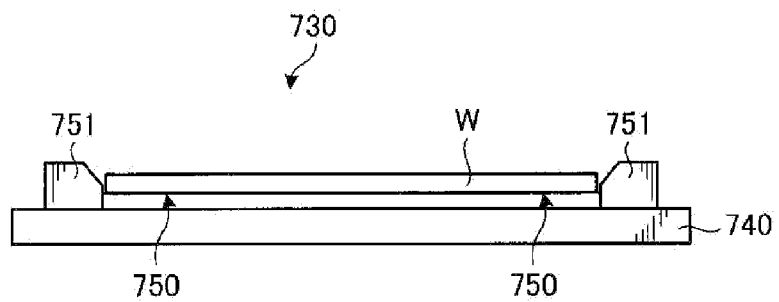
FIG. 8C is a schematic side view illustrating the configuration of the delivery arm.

Hereinafter, the configuration of the delivery unit 182 formed in the delivery block 18 will be described with reference to FIGS. 8A to 8C. FIG. 8A is a schematic plan view illustrating the configuration of the delivery unit 182. FIG. 8B is a schematic plan view illustrating the configuration of a delivery arm 730, and FIG. 8C is a schematic side view of the same. The configurations of the delivery units 181, 183, and 184 are the same as that of the delivery unit 182, and descriptions thereof will be omitted.

As illustrated in FIG. 8A, the delivery unit 182 includes the delivery arm 730 and support pins 731. The delivery arm 730 may deliver a substrate to be processed W, a supporting substrate S, and a superimposed substrate T between the conveyance device 141 of the conveyance region 14 and the conveyance device 191 of the conveyance region 19 (see FIG. 1). The support pins 731 are provided at a plurality of locations, for example, three locations, to support the substrate to be processed W, the supporting substrate S, and the superimposed substrate T.

The delivery arm 730 includes an arm unit 740 configured to hold the substrate to be processed W, the supporting substrate S, and the superimposed substrate T, and an arm driving unit 741 provided with, for example, a motor. The arm unit 740 is formed in a substantially disk shape. The arm driving unit 741 may move the arm unit 740 in the X direction. The arm driving unit 741 is attached to a rail 742 extending in the Y direction, and is configured to move on the rail 742. With the configuration described above, the delivery arm 730 is adapted to be movable in the horizontal direction (the X direction and the Y direction), and may smoothly deliver the substrate to be processed W or the supporting substrate S (the superimposed substrate T in a case of the delivery units 181 and 183) between the conveyance device 141 and the support pins 731.

As illustrated in FIGS. 8A and 8B, support pins 750 configured to support the substrate to be processed W or the supporting substrate S are provided at a plurality of locations, for example, four locations, on the arm unit 740. Guides 751 configured to position the substrate to be processed W or the supporting substrate S supported by the support pins 750 are provided on the arm unit 740. The guides 751 are provided at a plurality of locations, for example, four locations to guide the lateral surface of the substrate to be processed W or the supporting substrate S.

Cutouts 752 are formed at, for example, four locations in the outer periphery of the arm unit 740. With the aid of the cutouts 752, when the substrate to be processed W or the supporting substrate S is delivered from a conveyance arm of the conveyance device 141 to the delivery arm 730, the conveyance arm of the conveyance device 141 may be prevented from interfering with the arm unit 740.

Two slits 753 along the X direction are formed in the arm unit 740. The slits 753 are formed to extend from an end face of the arm unit 740 at the side of the support pins 731 to a position in the vicinity of the central portion of the arm unit 740. With the aid of the slits 753, the arm unit 740 may be prevented from interfering with the support pins 731.

<6. Configuration of Pre-Aligner>

Figure 9A:
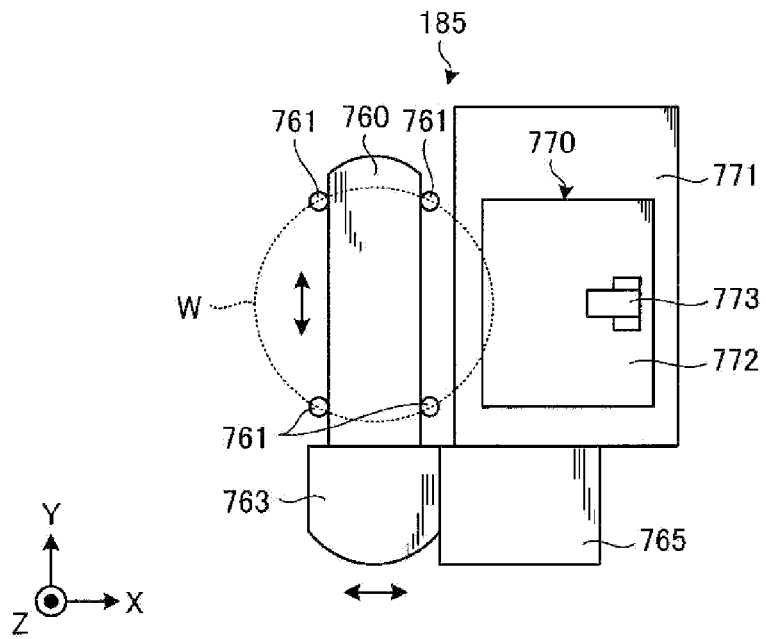
FIG. 9A is a schematic plan view illustrating the configuration of a pre-aligner.

Hereinafter, the configuration of the pre-aligner 185 will be described with reference to FIGS. 9A to 9C. FIG. 9A is a schematic plan view illustrating the configuration of the pre-aligner 185, and FIGS. 9B and 9C are schematic side views of the same.

Figure 9B:
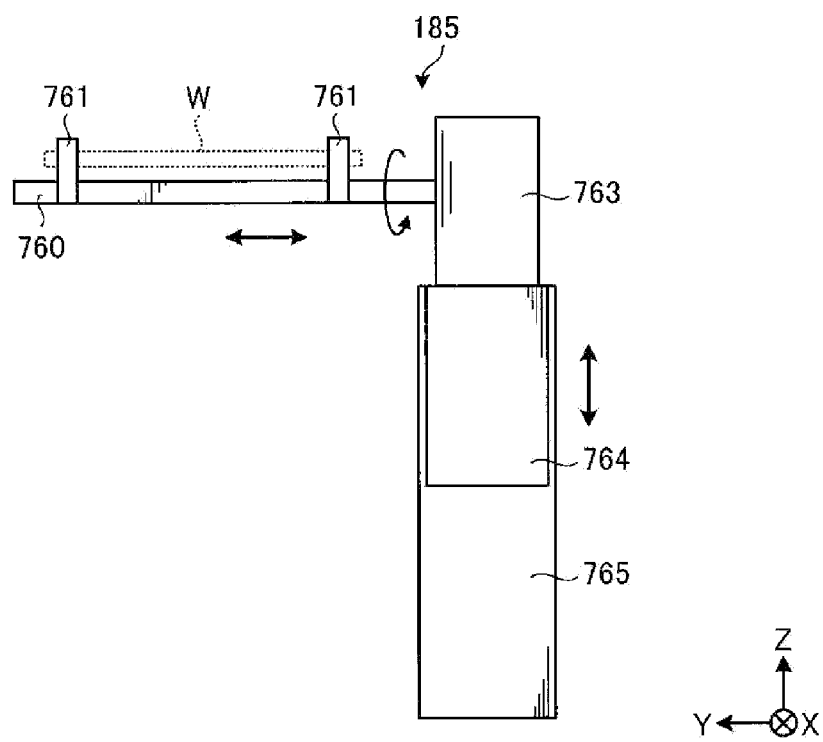
FIG. 9B is a schematic side view illustrating the configuration of the pre-aligner.
Figure 9C:
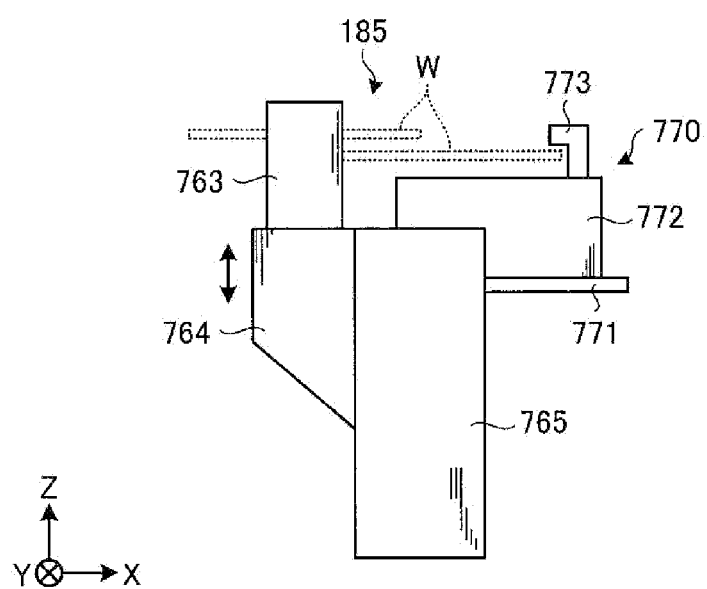
FIG. 9C is a schematic side view illustrating the configuration of the pre-aligner.

As illustrated in FIGS. 9A to 9C, the pre-aligner 185 includes a holding arm 760 configured to hold a substrate to be processed W or a supporting substrate S. The holding arm 760 extends in the Y direction. As another holding member, a holding member 761 configured to hold the substrate to be processed W or the supporting substrate S is provided at, for example, four locations in the holding arm 760. The holding members 761 are configured to be movable in the horizontal direction in relation to the holding arm 760. A cutout is formed at the lateral surface of each of the holding members 761 to hold the outer periphery of the substrate to be processed W or the supporting substrate S. The holding members 761 may hold the substrate to be processed W or the supporting substrate S sandwiched therebetween.

As illustrated in FIGS. 9A to 9C, the holding arm 760 is supported by a first driving unit 763 provided with, for example, a motor. By the first driving unit 763, the holding arm 760 may be rotatable around the horizontal axis and movable in the horizontal direction. While the holding arm 760 is rotated around the horizontal axis, the front and rear sides of the substrate to be processed W held by the holding arm 760 are inverted. The first driving unit 763 may rotate the holding arm 760 around the vertical axis so as to move the holding arm 760 in the horizontal direction.

A second driving unit 764 provided with, for example, a motor, is provided below the first driving unit 763. The second driving unit 764 allows the first driving unit 763 to move in the vertical direction along a supporting column 765 extending in the vertical direction. In this manner, with the aid of the first driving unit 763 and the second driving unit 764, the substrate to be processed W or the supporting substrate S held by the holding members 761 may be rotated around the horizontal axis and moved in the vertical direction and the horizontal direction.

In the supporting column 765, a position control mechanism 770 configured to adjust the horizontal orientation of the substrate to be processed W or the supporting substrate S held by the holding members 761 is supported through a supporting plate 771. The position control mechanism 770 is provided adjacently to the holding arm 760.

The position control mechanism 770 has a base 772, and a detection part 773 configured to detect the position of a notch of the substrate to be processed W or the supporting substrate S. In the position control mechanism 770, the position of the notch of the substrate to be processed W or the supporting substrate S is detected by the detection part 773 while moving the substrate to be processed W or the supporting substrate S held by the holding members 761 in the horizontal direction. Thus, the position of the notch is adjusted so as to adjust the horizontal orientation of the substrate to be processed W or the supporting substrate S.

<7. Configuration of Bonding Device>

Figure 10A:
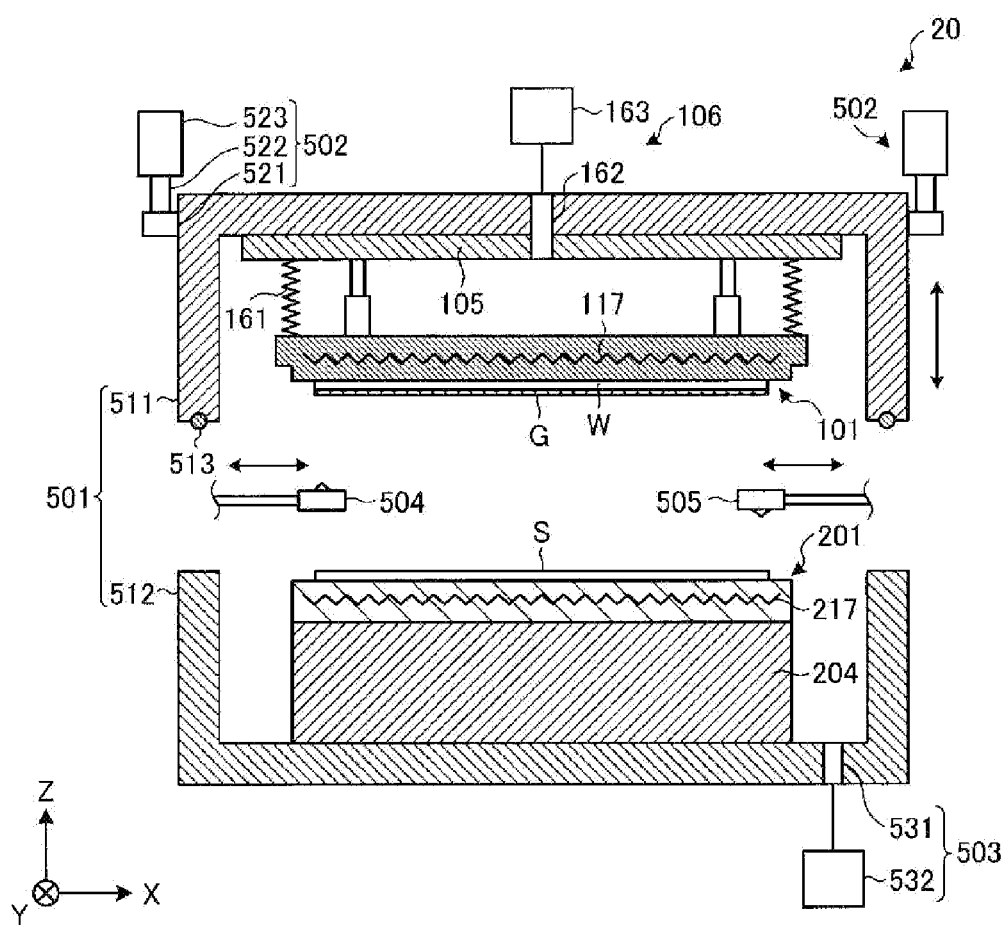
FIG. 10A is a schematic side view illustrating the configuration of a bonding device.
Figure 10B:
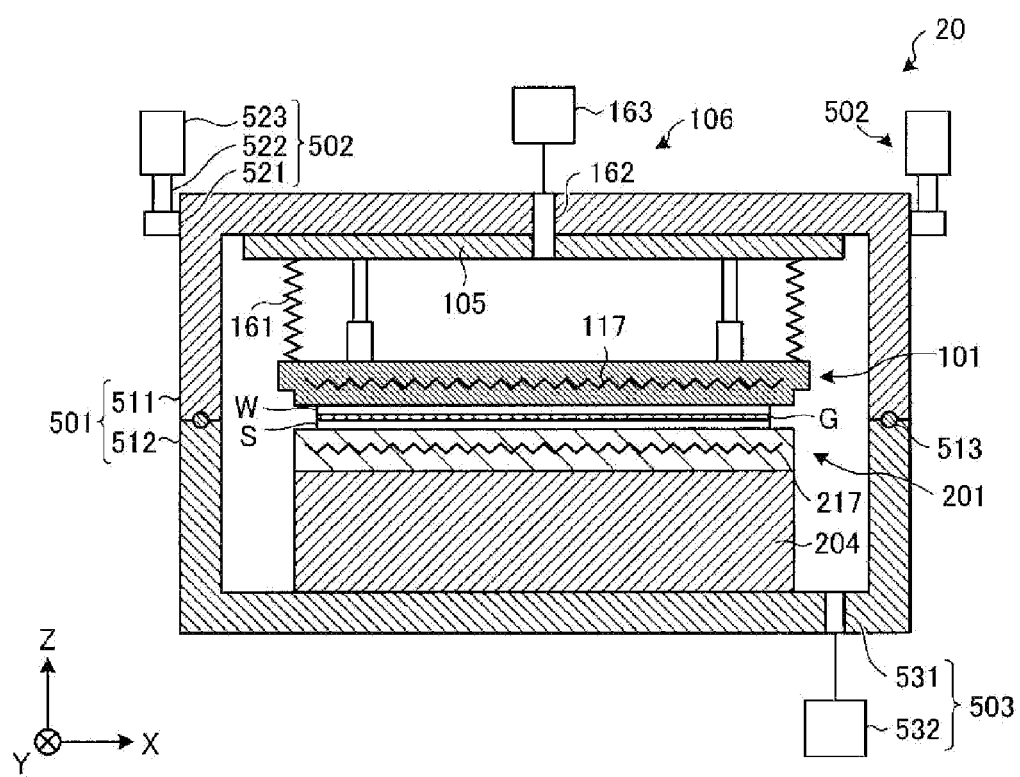
FIG. 10B is a schematic side view illustrating the configuration of the bonding device.

Hereinafter, the configuration of the bonding device 20 will be described with reference to FIGS. 10A and 10B. FIGS. 10A and 10B are schematic side views illustrating the configuration of the bonding device 20.

As illustrated in FIG. 10A, the bonding device 20 includes a first holding unit 101 and a second holding unit 201. The first holding unit 101 is disposed above the second holding unit 201 to hold a substrate to be processed W. The second holding unit 201 holds a supporting substrate S. Each of the first holding unit 101 and the second holding unit 201 is formed in a substantially disk shape having a larger diameter than the substrate to be processed W and the supporting substrate S.

Each of the first holding unit 101 and the second holding unit 201 is, for example, an electrostatic chuck, and holds the substrate to be processed W and the supporting substrate S through electrostatic attraction. By using the electrostatic chuck as each of the first holding unit 101 and the second holding unit 201, the substrate to be processed W and the supporting substrate S may be securely held under a reduced pressure atmosphere. Each of the first holding unit 101 and the second holding unit 201 is not limited to the electrostatic chuck, but may be, for example, a porous chuck configured to hold the substrate to be processed W and the supporting substrate S through vacuum suction.

Each of the first holding unit 101 and the second holding unit 201 includes a heating mechanism 117 and 217 embedded therein. The heating mechanism 117 heats the substrate to be processed W held by the first holding unit 101, and the heating mechanism 217 heats the supporting substrate S held by the second holding unit 201. The second holding unit 201 is supported at a predetermined height by a spacer 204.

The bonding device 20 includes a base member 105 and a pressurization mechanism 106. The base member 105 is attached to the top of a first chamber portion 511 to be described later.

The pressurization mechanism 106 moves the first holding unit 101 vertically downwards so that the substrate to be processed W is pressurized by coming in contact with the supporting substrate S. The pressurization mechanism 106 includes a pressure vessel 161, a gas supply tube 162, and a gas supply source 163.

The pressure vessel 161 is constituted by, for example, a bellows which is extendible and retractable in the vertical direction and formed of stainless steel. The bottom surface of the pressure vessel 161 is fixed to the top surface of the first holding unit 101, and the top surface of the pressure vessel 161 is fixed to the bottom surface of the base member 105.

One end of the gas supply tube 162 is connected to the pressure vessel 161 through the base member 105 and the first chamber portion 511 to be described later, and the other end is connected to the gas supply source 163.

In the pressure vessel 161, when a gas is supplied into the pressure vessel 161 from the gas supply source 163 through the gas supply tube 162, the pressure vessel 161 is extended to lower the first holding unit 101. Accordingly, the substrate to be processed W comes in contact with the supporting substrate S and is pressurized. A pressurizing force between the substrate to be processed W and the supporting substrate S is controlled by controlling the pressure of the gas to be supplied to the pressure vessel 161.

The bonding device 20 includes a chamber 501, a moving mechanism 502, a pressure reducing mechanism 503, a first image-capturing unit 504, and a second image-capturing unit 505.

The chamber 501 is a processing container of which the inside may be closed, and includes the first chamber portion 511 and a second chamber portion 512. The first chamber portion 511 is a bottomed cylindrical vessel having an opened lower portion, and accommodates, for example, the first holding unit 101 and the pressure vessel 161 therein. The second chamber portion 512 is a bottom cylindrical vessel having an opened upper portion, and accommodates, for example, the second holding unit 201, and the spacer 204 therein.

The first chamber portion 511 is configured to be lifted vertically by a lift mechanism (not illustrated) such as, for example, an air cylinder. When the first chamber portion 511 is lowered by the lift mechanism to come in contact with the second chamber portion 512, a sealed space is formed within the chamber 501. A seal member 513 configured to secure air-tightness of the chamber 501 is provided in the contact surface between the first chamber portion 511 and the second chamber portion 512. As the seal member 513, for example, an O ring is used.

The moving mechanism 502 is provided at the outer periphery of the first chamber portion 511 to move the first holding unit 101 in the horizontal direction through the first chamber portion 511. A plurality of moving mechanisms 502 (e.g., five moving mechanisms) are provided at the outer periphery of the first chamber portion 511, in which among the five moving mechanisms 502, four are used for horizontal movement of the first holding unit 101, and one is used for rotation of the first holding unit 101 around the vertical axis.

The moving mechanism 502 includes a cam 521 which is in contact with the outer periphery of the first chamber portion 511 to move the first holding unit 101, and a rotation driving unit 523 configured to rotate the cam 521 through a shaft 522. The cam 521 is formed eccentrically in relation to the central axis of the shaft 522. When the cam 521 is rotated by the rotation driving unit 523, the central position of the cam 521 in relation to the first holding unit 101 is moved so that the first holding unit 101 is moved in the horizontal direction.

The pressure reducing mechanism 503 is provided below, for example, the second chamber portion 512 to decompress the inside of the chamber 501. The pressure reducing mechanism 503 includes an intake pipe 531 configured to take in the atmosphere within the chamber 501, and an intake device 532 such as, for example, a vacuum pump connected to the intake pipe 531.

The first image-capturing unit 504 is disposed below the first holding unit 101 to capture the image of the surface of the substrate to be processed W held by the first holding unit 101. The second image-capturing unit 505 is disposed above the second holding unit 201 to capture the image of the surface of the supporting substrate S held by the second holding unit 201.

The first image-capturing unit 504 and the second image-capturing unit 505 are configured to be moved in the horizontal direction by a moving mechanism (not illustrated), and intrude into the chamber 501 and capture the image of the substrate to be processed W and the supporting substrate S before the first chamber portion 511 is lowered. The data image-captured by the first image-capturing unit 504 and the second image-capturing unit 505 are transmitted to the control device 5. As for each of the first image-capturing unit 504 and the second image-capturing unit 505, for example, a wide-angle type CCD camera is used.

The bonding device 20 is provided within a processing container (not illustrated), and a FFU is provided in the ceiling portion of the processing container.

In the bonding device 20 configured as described above, first, the substrate to be processed W is held by the first holding unit 101, and the supporting substrate S is held by the second holding unit 201.

Then, in the bonding device 20, the first image-capturing unit 504 and the second image-capturing unit 505 as illustrated in FIG. 10A move in the horizontal direction to intrude into the chamber 501 and capture the image of the surfaces of the substrate to be processed W and the supporting substrate S, respectively.

Then, the position in the horizontal direction of the substrate to be processed W is controlled by the moving mechanisms 502 so that a position of a reference point of the substrate to be processed W displayed on an image captured by the first image-capturing unit 504 is coincident with a position of a reference point of the supporting substrate S displayed on an image captured by the second image-capturing unit 505. In this manner, the position in the horizontal direction of the substrate to be processed W in relation to the supporting substrate S is controlled.

Then, the first image-capturing unit 504 and the second image-capturing unit 505 are retreated from the inside of the chamber 501, and the first chamber portion 511 is lowered by a moving mechanism (not illustrated). The first chamber portion 511 comes in contact with the second chamber portion 512 to form a sealed space within the chamber 501.

Then, in the bonding device 20, the pressure reducing mechanism 503 takes in the atmosphere within the chamber 501 so that the inside of the chamber 501 is decompressed.

Then, in the bonding device 20, the substrate to be processed W and the supporting substrate S are heated at a predetermined temperature (e.g., 200° C. to 250° C.) by the heating mechanism 117 of the first holding unit 101 and the heating mechanism 217 of the second holding unit 201.

Then, in the bonding device 20, a gas is supplied to the pressure vessel 161 so that the inside of the pressure vessel 161 is controlled to be a desired pressure. Accordingly, the first holding unit 101 is lowered so that the substrate to be processed W and the supporting substrate S are pressurized at a desired pressure (see FIG. 10B). Accordingly, the substrate to be processed W is bonded to the supporting substrate S.

<8. Operation of Bonding System>

Figure 11:
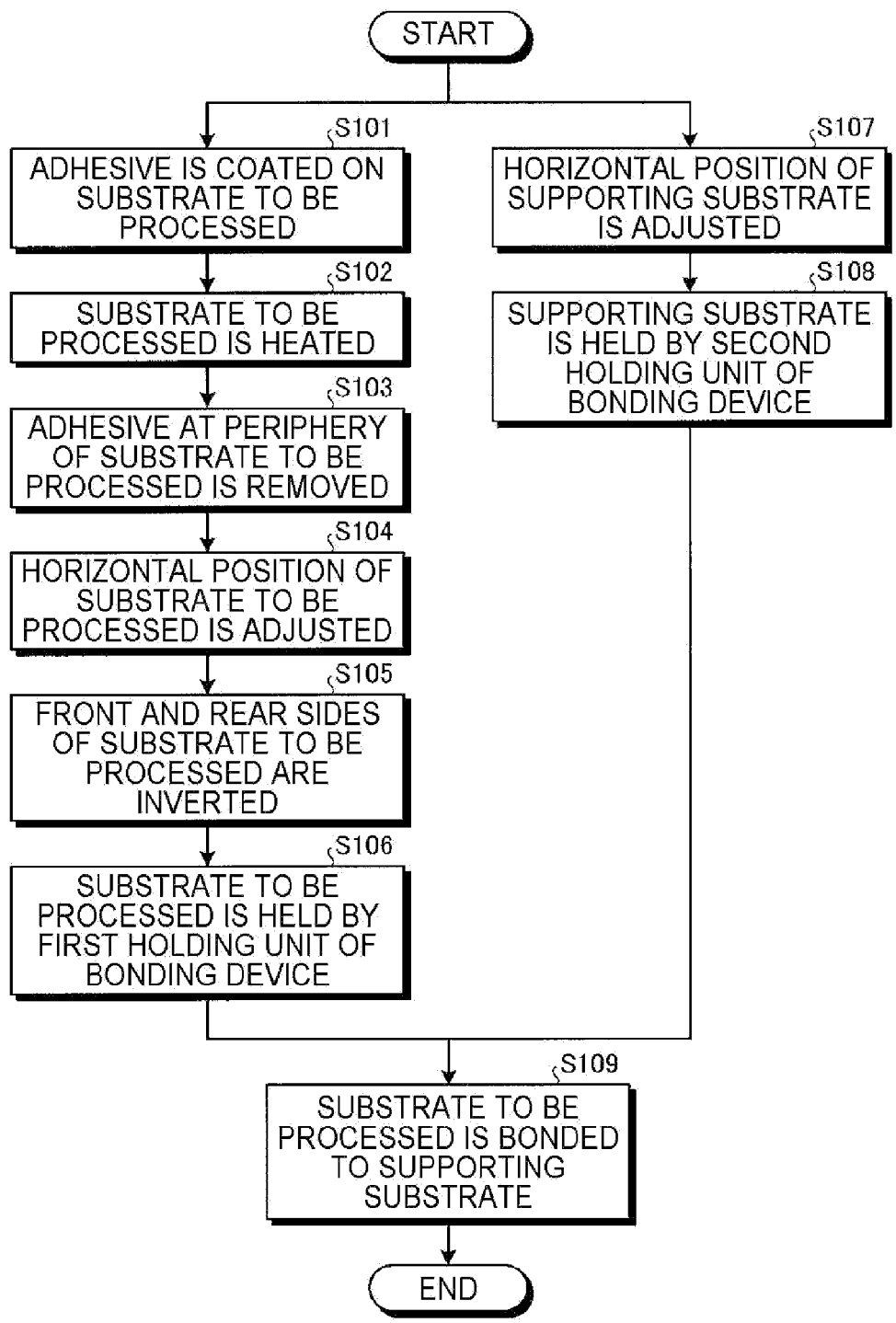
FIG. 11 is a flow chart illustrating a processing sequence of a process performed by the bonding system.

Hereinafter, the operation of the bonding system 1 as described above will be described with reference to FIG. 11. FIG. 11 is a flow chart illustrating a processing sequence of a process performed by the bonding system 1.

First, a substrate to be processed W is taken out of the cassette Cw by the conveyance device 122 of the carry-in/ out station 2 and placed on the delivery unit 132 of the delivery block 13. Then, the substrate to be processed W is taken out of the delivery unit 132 by the conveyance device 141 of the conveyance region 14, and is carried into the coating device 15, and then a bonded surface Wj is coated with an adhesive G by the coating device 15 (step S101).

Then, the substrate to be processed W is taken out of the coating device 15 by the conveyance device 141, is carried into the heating device 16, and heated to a predetermined temperature by the heating device 16 (step S102). Accordingly, a solvent, such as, for example, an organic solvent, included in the adhesive G is evaporated so that the adhesive G becomes hard.

Then, the substrate to be processed W is taken out of the heating device 16 by the conveyance device 141, and is carried into the removal device 17. Then, the adhesive G at the periphery of the substrate to be processed W is removed by the removal device 17 (step S103). Then, the substrate to be processed W is taken out of the removal device 17 by the conveyance device 141, and is carried into the delivery unit 182 of the delivery block 18.

Here, it has been described that the adhesive G coated on the periphery of the substrate to be processed W is removed by the removal device 17 and then the substrate to be processed W is conveyed to the delivery unit 182. However, the substrate to be processed W may be conveyed again to the heating device 16 and heated in the heating device 16 before conveyed to the delivery unit 182.

Then, the substrate to be processed W is taken out of the delivery unit 182 by the conveyance device 191 of the conveyance region 19, and carried into the pre-aligner 185, and then the horizontal position of the substrate to be processed W is adjusted by the pre-aligner 185 (step S104). The front and rear sides of the substrate to be processed W are inverted by the pre-aligner 185 (step S105).

Then, the substrate to be processed W is taken out of the pre-aligner 185 by the conveyance device 191, is carried into the bonding device 20, and sucked and held by the first holding unit 101 of the bonding device 20 (step S106).

Meanwhile, the supporting substrate S is taken out of the cassette Cs by the conveyance device 122 of the carry-in/out station 2, and placed on the delivery unit 132 of the delivery block 13. Then, the supporting substrate S is taken out of the delivery unit 132 by the conveyance device 141 of the conveyance region 14, and is carried into the delivery unit 182 of the delivery block 18.

Then, the supporting substrate S is taken out of the delivery unit 182 by the conveyance device 191 of the conveyance region 19, and is carried into the pre-aligner 185, and then the horizontal position of the supporting substrate S is adjusted by the pre-aligner 185 (step S107).

Then, the supporting substrate S is taken out of the pre-aligner 185 by the conveyance device 191, is carried into the bonding device 20, and sucked and held by the second holding unit 201 of the bonding device 20 (step S108).

Then, the substrate to be processed W is held by the first holding unit 101, and the supporting substrate S is held by the second holding unit 201, and the bonding device 20 bonds the substrate to be processed W to the supporting substrate S (step S109). Accordingly, a superimposed substrate T is formed.

After the first chamber portion 511 is moved up by a moving mechanism (not illustrated), the superimposed substrate T formed as described above is carried out of the bonding device 20 by the conveyance device 191 of the conveyance region 19 (see FIG. 1), and conveyed to the cassette Ct in the order as described above.

As described above, the bonding system 1 according to the present exemplary embodiment includes the first processing station 3, the second processing station 4 and the carry-in/out station 2. The first processing station 3 and the second processing station 4 perform a predetermined processing on the substrate to be processed W and the supporting substrate S. The carry-in/out station 2 carries the substrate to be processed W, the supporting substrate S and the superimposed substrate T into or out of the first processing station 3.

The first processing station 3 includes the conveyance region 14, the coating device 15, the heating device 16, and the delivery block 13. The conveyance region 14 is a region for conveying the substrate to be processed W, the supporting substrate S and the superimposed substrate T. The coating device 15 is disposed to be adjacent to the conveyance region 14, and coats an adhesive G to the substrate to be processed W. The heating device 16 is disposed to be adjacent to the conveyance region 14, and heats the substrate to be processed W coated with the adhesive G. The delivery block 13 delivers the substrate to be processed W, the supporting substrate S and the superimposed substrate T between the carry-in/out station 2 and the conveyance region 14.

The second processing station 4 includes the plurality of bonding devices 20, the conveyance region 19, and the delivery block 18. The plurality of bonding devices 20 bonds the substrate to be processed W and the supporting substrate S to each other. The conveyance region 19 is a region for conveying the substrate to be processed W and the supporting substrate S to and from the plurality of bonding devices 20. The delivery block 18 delivers the substrate to be processed W, the supporting substrate S and the superimposed substrate T between the conveyance region 14 and the conveyance region 19.

Accordingly, according to the bonding system 1 according to the present exemplary embodiment, a footprint may be reduced as compared to a conventional bonding system.

Other Exemplary Embodiments

However, the configuration of the bonding system disclosed in the present disclosure is not limited to the above described configuration. Therefore, hereinafter, modified exemplary embodiments of a bonding system will be described with reference to FIGS. 12A to 12D. FIGS. 12A to 12D are schematic plan views illustrating the configurations of the bonding system according to first to fourth modified exemplary embodiments. Meanwhile, in the following description, the same parts as those which have already been described are given the same reference numerals, and redundant descriptions thereof will be omitted.

Figure 12A:
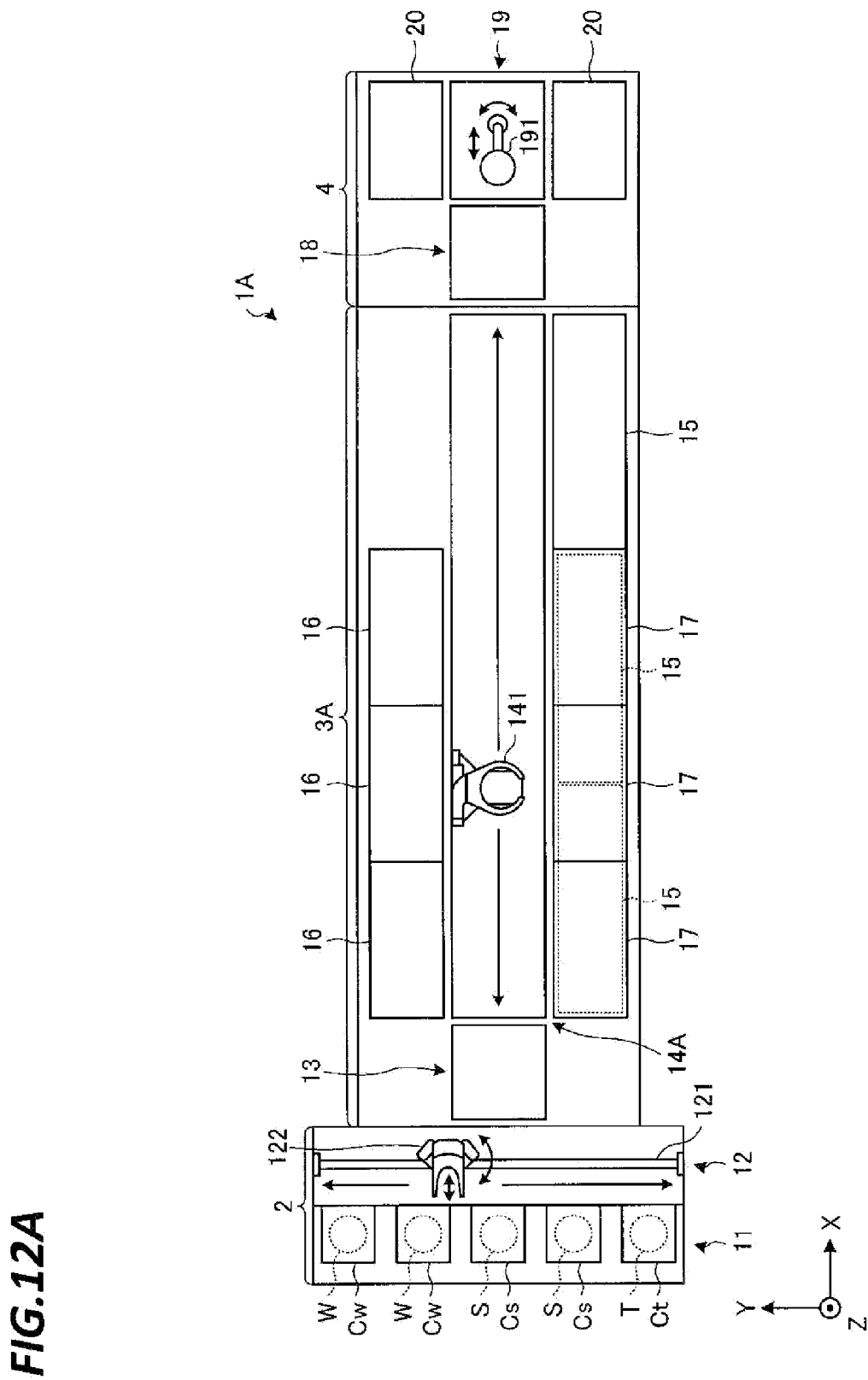
FIG. 12A is a schematic plan view illustrating the configuration of a bonding system according to a first modified exemplary embodiment.

For example, a bonding system 1A illustrated in FIG. 12A includes a first processing station 3A. The first processing station 3A includes a conveyance region 14A which is longer in the X direction than the conveyance region 14 provided in the first processing station 3.

The first processing station 3A includes three coating devices 15. The three coating devices 15 are disposed to be aligned along the conveyance region 14A at the negative Y direction side of the conveyance region 14A.

In this manner, the bonding system 1A may be configured to include the three coating devices 15. The three coating devices 15 may be provided for, for example, different kinds of adhesives G, respectively. That is, the three coating devices 15 may coat different kinds of adhesives G, respectively. In this case, a plurality of kinds of adhesives G may be coated on a substrate to be processed W.

A bonding system 1B as illustrated in FIG. 12B includes a first processing station 3B. The first processing station 3B includes a conveyance region 14B which is longer in the X direction than the conveyance region 14 provided in the first processing station 3.

In the first processing station 3B, four heating devices 16 stacked in multiple stages form a block, and two columns of such blocks are disposed to be aligned along the conveyance direction. That is, the number of columns of blocks provided in the first processing station 3B, each block including the four heating devices 16 stacked therein, is less than that in the first processing station 3 by one.

The first processing station 3B includes three coating devices 15. Among the three coating devices 15, two are disposed at the negative Y direction side of the conveyance region 14B, and the other one is disposed at the positive Y direction side of the conveyance region 14B.

In this manner, when the three coating devices 15 are provided, the number of the heating devices 16 may be reduced, and one of the three coating devices 15 may be disposed at the side at which the heating devices 16 are provided. Accordingly, as compared to the bonding system 1A according to a first modified exemplary embodiment, the length of the conveyance region 14B may be reduced.

Figure 12C:
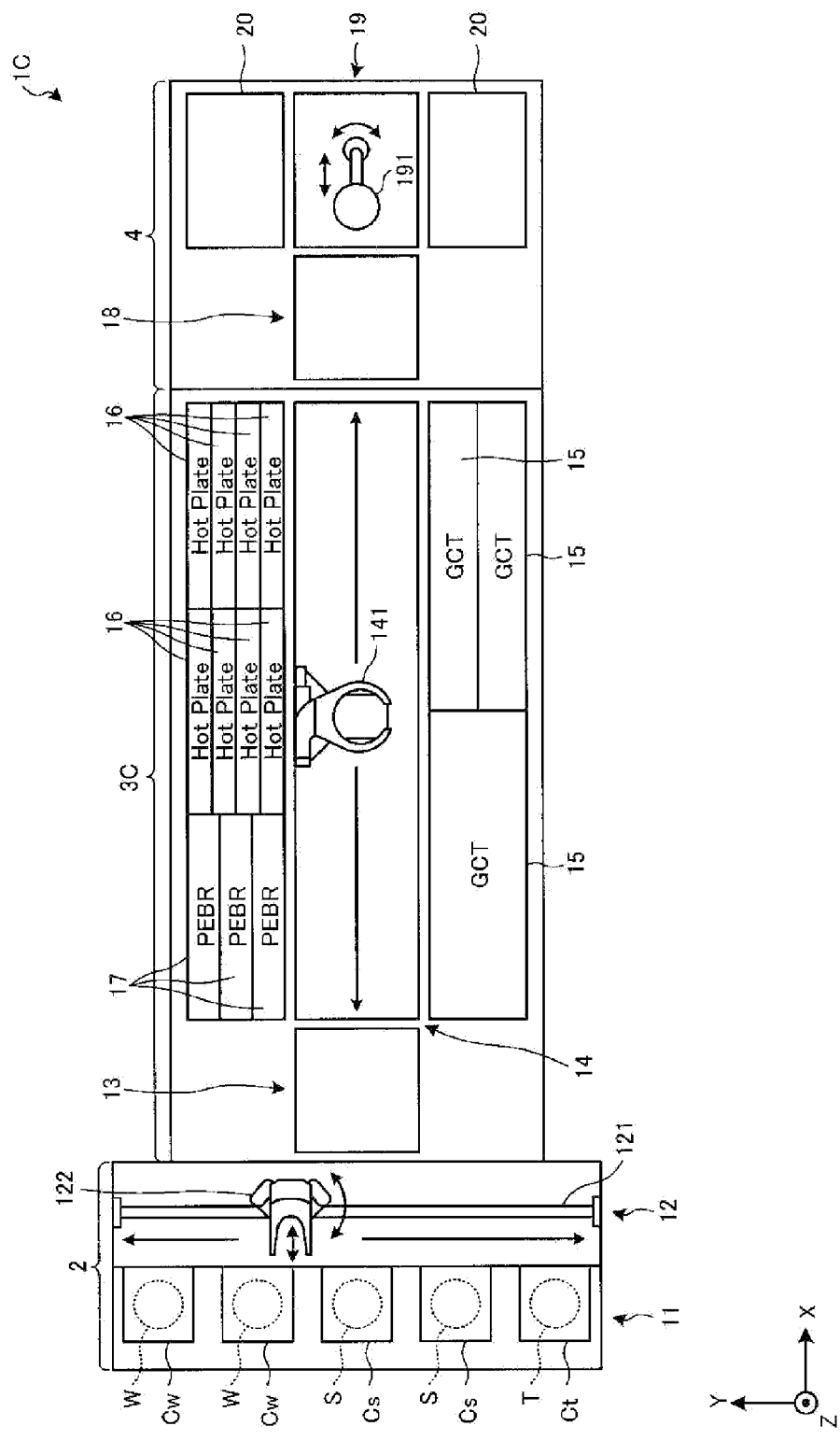
FIG. 12C is a schematic plan view illustrating the configuration of a bonding system according to a third modified exemplary embodiment.

A bonding system 1C as illustrated in FIG. 12C includes a first processing station 3C. Like in the first processing station 3B according to a second modified exemplary embodiment, in the first processing station 3C, four heating devices 16 stacked in multiple stages form a block, and two columns of such blocks are disposed to be aligned along the conveyance direction. In the first processing station 3C, three removal devices 17 are disposed at the positive Y direction side of the conveyance region 14, that is, at the side at which the plurality of heating devices 16 are disposed.

In the first processing station 3C, three coating devices 15 are disposed at the negative Y direction side of the conveyance region 14. Among the three coating devices 15, two are stacked.

When the three coating devices 15 are provided in this manner, the number of the heating devices 16 may be reduced, and the removal devices 17 may be disposed at the side at which the heating devices 16 are provided. Further, the three coating devices 15 may be disposed at the opposite side to the side at which the heating devices 16 and the removal devices 17 are provided, and among the three coating devices 15, two may be stacked. Accordingly, the three coating devices 15 may be disposed with the same footprint as that of the bonding system 1.

Meanwhile, when different kinds of adhesives G are used in the three coating devices 15, it is desirable that among the two stacked coating devices 15, a device having a lower viscosity of an adhesive G to be used is disposed at the upper side.

Figure 12D:
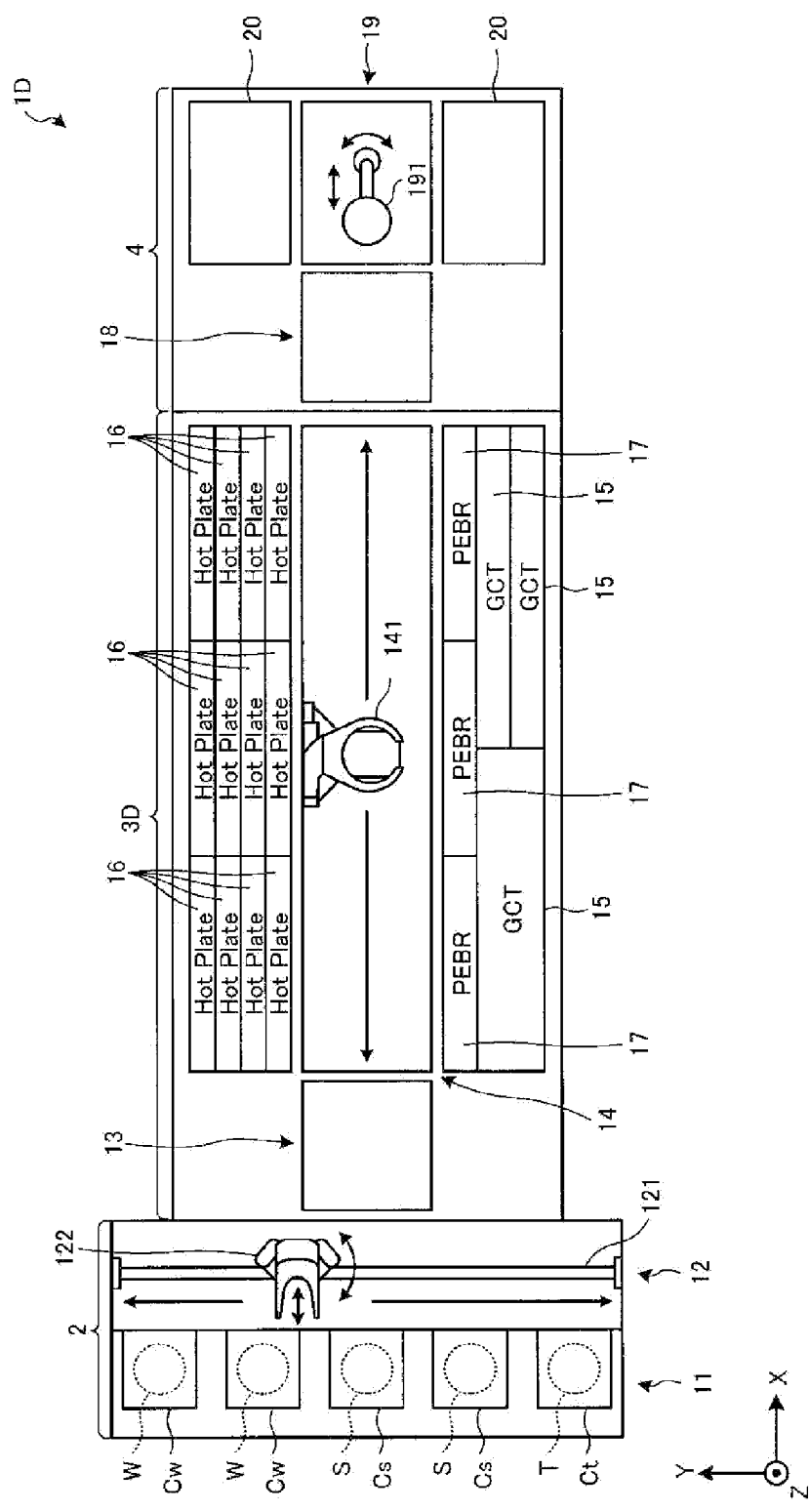
FIG. 12D is a schematic plan view illustrating the configuration of a bonding system according to a fourth modified exemplary embodiment.

A bonding system 1D as illustrated in FIG. 12D includes a first processing station 3D. The first processing station 3D includes three coating devices 15. Like in the first processing station 3C according to a third modified exemplary embodiment, the three coating devices 15 are disposed at the negative Y direction side of the conveyance region 14, and among the three coating devices 15, two are stacked.

In the first processing station 3D, three removal devices 17 are further stacked on the top of the three coating devices 15. An organic solvent used in the removal devices 17 has a lower viscosity than the adhesive G used in the three coating devices 15.

In this manner, among the three coating devices 15, two devices may be stacked, and also the removal devices 17 may be stacked on the top of the three coating devices 15. Accordingly, the three coating devices 15 may be disposed with the same footprint as that of the bonding system 1 without reducing the number of heating devices 16.

Meanwhile, in FIGS. 12A to 12D, an example of a case where three coating devices 15 are provided in the first processing station 3A to 3D has been described, but four or more coating devices 15 may be provided in the first processing station 3A to 3D.

In the above described exemplary embodiments, an example of a case where a substrate to be processed W is a "first substrate", and a supporting substrate S is a "second substrate" has been described. However, the present disclosure is not limited thereto. The supporting substrate S may be a "first substrate", and the substrate to be processed W may be a "second substrate." That is, the supporting substrate S may be a substrate which is to be subjected to processings of the coating device 15, the heating device 16, and the removal device 17, and the substrate to be processed W may be a substrate which is conveyed to the second processing station 4 without being subjected to processings of the coating device 15, the heating device 16, and the removal device 17. In this manner, an adhesive G may be coated on the supporting substrate S.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A bonding system configured to bond a first substrate to a second substrate, the bonding system comprising:
   a first processing station and a second processing station configured to perform a predetermined processing on the first substrate and the second substrate; and
   a carry-in/out station configured to carry the first substrate, the second substrate, and a superimposed substrate obtained by bonding the first substrate to the second substrate into/out of the first processing station,
   wherein the first processing station includes:
      a first conveyance region configured to convey the first substrate, the second substrate and the superimposed substrate,
      a coating device disposed to be adjacent to the first conveyance region and configured to coat an adhesive on the first substrate,
      a heating device disposed to be adjacent to the first conveyance region and configured to heat the first substrate coated with the adhesive, and
      a first delivery block configured to deliver the first substrate, the second substrate and the superimposed substrate between the carry-in/out station and the first conveyance region, and
   the second processing station includes:
      a plurality of bonding devices each of which is configured to bond the first substrate to the second substrate,
      a second conveyance region configured to convey the first substrate and the second substrate to and from the plurality of bonding devices, and
      a second delivery block configured to deliver the first substrate, the second substrate and the superimposed substrate between the first conveyance region and the second conveyance region,
wherein the second delivery block includes:
a second delivery unit on which the first substrate or the second substrate to be carried into the second conveyance region, or the superimposed substrate to be carried into the first conveyance region is placed, and
an inversion mechanism configured to invert the first substrate or the second substrate,
wherein the second delivery unit and the inversion mechanism are stacked in multiple stages.

2. The bonding system of claim 1, wherein the first processing station includes a removal device configured to remove the adhesive from a periphery of the first substrate coated with the adhesive, and
the removal device is disposed above the coating device.

3. The bonding system of claim 1, wherein the first delivery block includes:
a first delivery unit on which the first substrate or the second substrate to be carried into the first conveyance region, or the superimposed substrate to be carried into the carry-in/out station is placed, and
a buffer unit configured to temporarily hold the second substrate carried into the first conveyance region through the first delivery block.

4. The bonding system of claim 1, wherein the second conveyance re ion and the bonding devices are configured such that a pressure within the second conveyance region is a positive pressure in relation to a pressure within the bonding devices.

5. The bonding system of claim 2, wherein the first conveyance region, the coating device, the heating device, and the removal device are configured such that a pressure within the first conveyance region is a positive pressure in relation to a pressure within the coating device, a pressure within the heating device and a pressure within the removal device.

6. The bonding system of claim 5, wherein the removal device, the coating device, and the heating device are configured such that the pressure within the removal device is a negative pressure in relation to the pressure within the coating device and the pressure within the heating device.

7. The bonding system of claim 1, wherein the coating device is disposed at one side of the first conveyance region, and
the heating device is disposed at another side of the first conveyance region.

* * * * *